(12) United States Patent
Lee et al.

(10) Patent No.: US 12,514,077 B2
(45) Date of Patent: Dec. 30, 2025

(54) DISPLAY DEVICE AND DISPLAY PANEL INCLUDING OPTICAL AREA

(71) Applicant: LG Display Co., Ltd., Seoul (KR)

(72) Inventors: SeungHyun Lee, Paju-si (KR); JuhnSuk Yoo, Seoul (KR); Mihee Shin, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 546 days.

(21) Appl. No.: 17/973,176

(22) Filed: Oct. 25, 2022

(65) Prior Publication Data

US 2023/0172029 A1 Jun. 1, 2023

(30) Foreign Application Priority Data

Dec. 1, 2021 (KR) .................. 10-2021-0169839

(51) Int. Cl.
*H10K 59/65* (2023.01)
*H10K 59/131* (2023.01)
*H10K 59/35* (2023.01)

(52) U.S. Cl.
CPC ........... *H10K 59/65* (2023.02); *H10K 59/131* (2023.02); *H10K 59/353* (2023.02)

(58) Field of Classification Search
CPC .... H10K 59/65; H10K 59/353; H10K 59/131; H10K 59/121; H10K 59/30; H10K 59/126; H01L 27/3276
See application file for complete search history.

(56) References Cited

U.S. PATENT DOCUMENTS

2023/0178032 A1\* 6/2023 Kim .................... G09G 3/3266

\* cited by examiner

Primary Examiner — Suberr L Chi
(74) Attorney, Agent, or Firm — Birch, Stewart, Kolasch & Birch, LLP

(57) ABSTRACT

A display device including a display panel including a plurality of light emitting areas; and a first optical electronic device located under the display panel. Further, a first optical display area of the display panel overlapping the first optical electronic device comprises a plurality of first light transmission areas in addition to the light emitting areas, a non-overlapping display area of the display panel not overlapping the first optical electronic device includes the light emitting areas without including the first light transmission areas, and a plurality of first horizontal lines for controlling the light emitting areas horizontally extend across the non-overlapping display area and the first optical display area. In addition, the light emitting areas included in the non-overlapping display area and the first optical area are arranged in a same row, a same first horizontal line controls the light emitting areas arranged in the same row in the non-overlapping display area and the first optical display area, the same first horizontal line comprise a first portion extending horizontally across the non-overlapping display area, a second portion extending horizontally across the first optical display area, and a connection portion located in the first optical display area and connecting the first portion and the second portion, and the connection portion is angled with respect to the first and second portions such that the second portion is shifted upwards or downwards from the first portion.

20 Claims, 22 Drawing Sheets

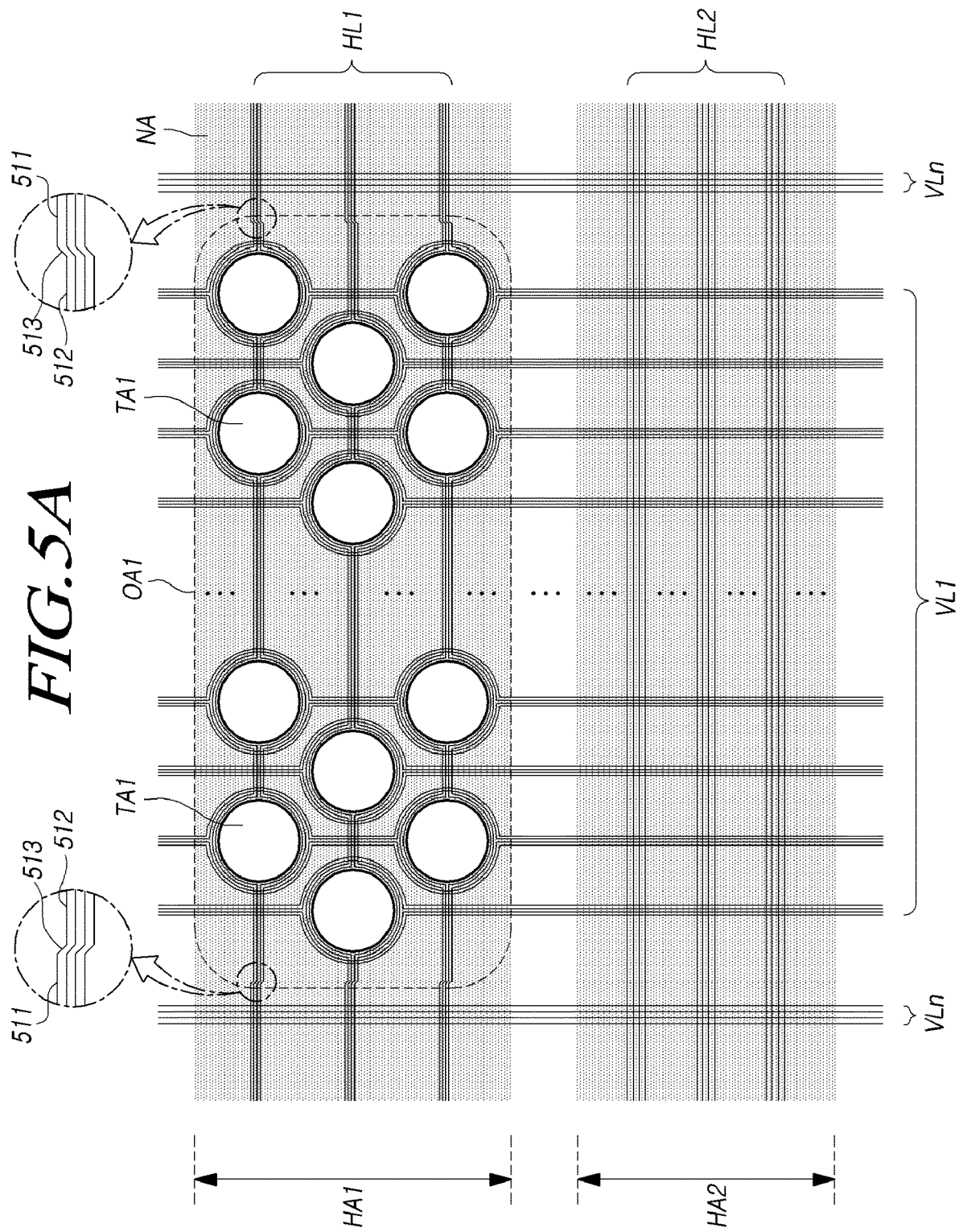

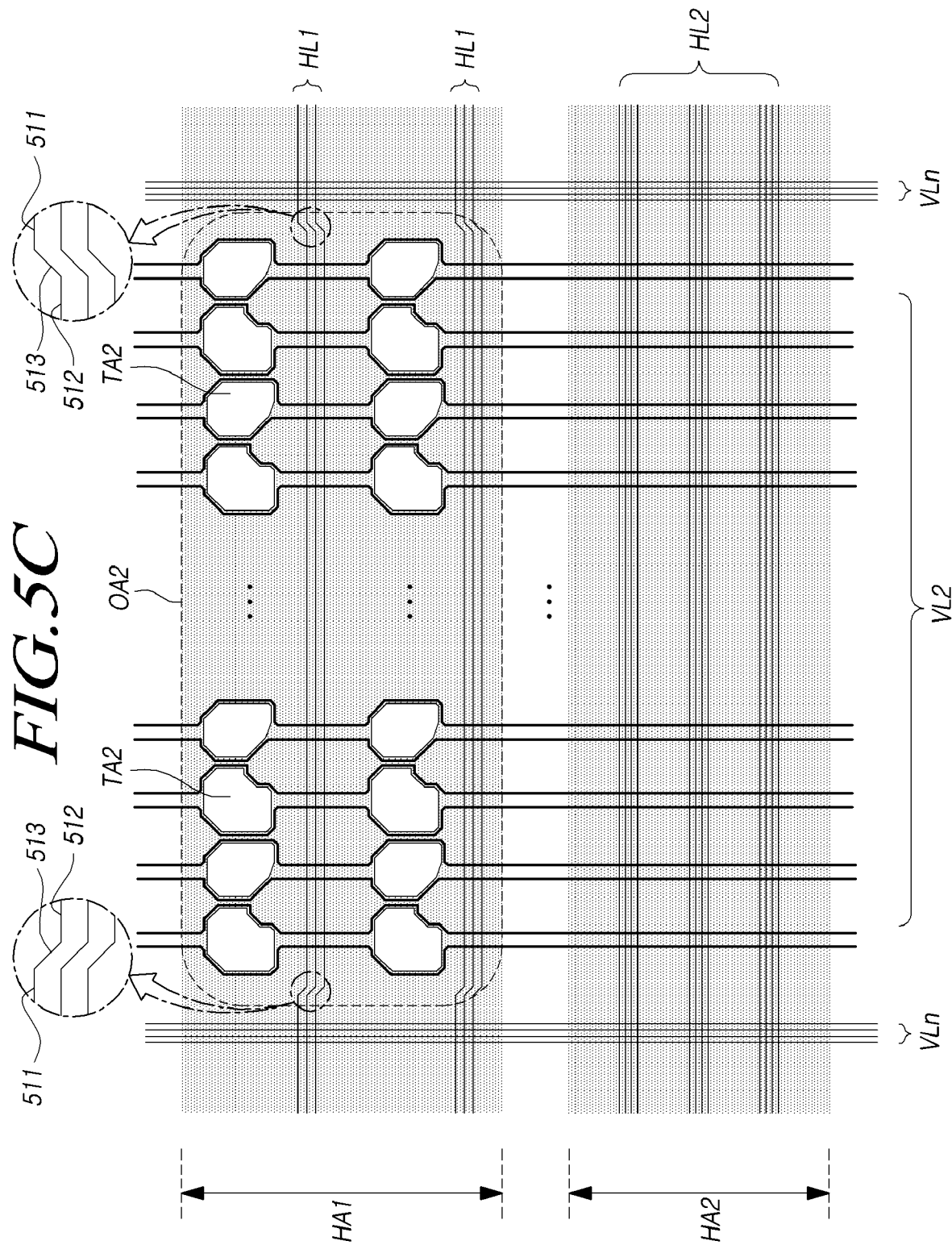

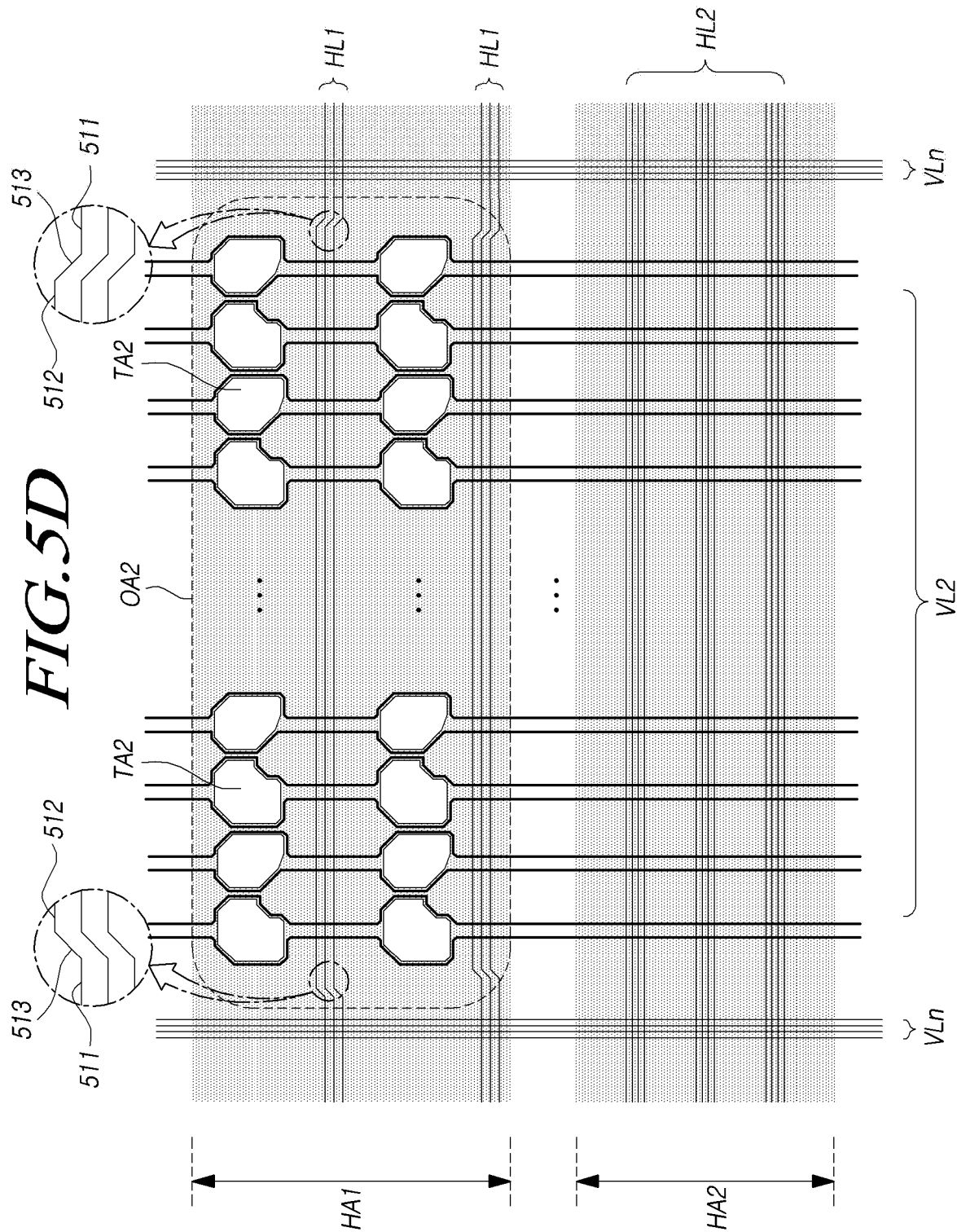

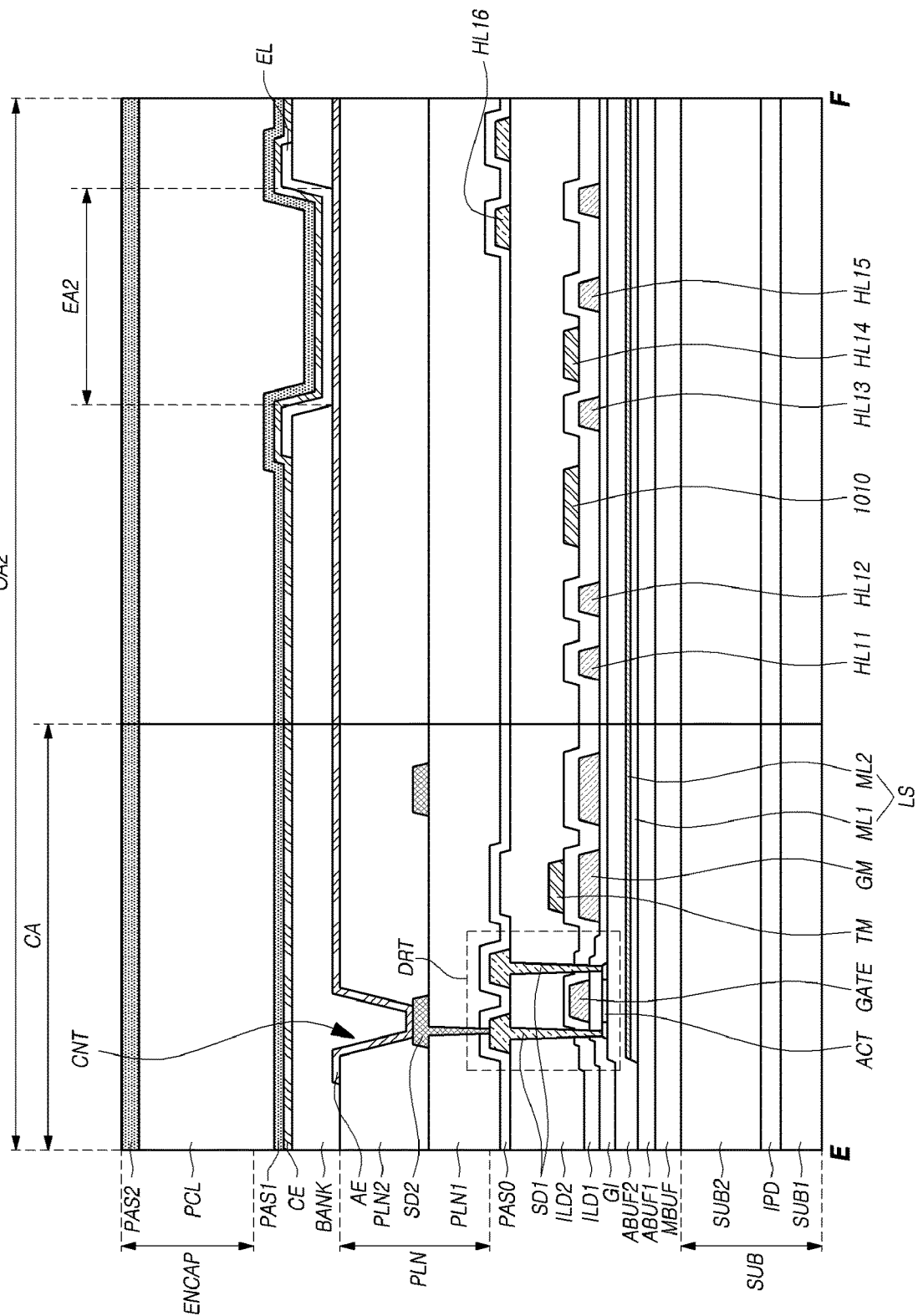

DISPLAY DEVICE AND DISPLAY PANEL INCLUDING OPTICAL AREA

CROSS-REFERENCE TO RELATED APPLICATION

This application claims the priority benefit of Republic of Korea Patent Application No. 10-2021-0169839, filed on Dec. 1, 2021, in the Korean Intellectual Property Office, the entire contents of which is hereby incorporated by reference into the present application.

BACKGROUND OF THE DISCLOSURE

Technical Field

The present disclosure relates to electronic devices, and more particularly, to a display device and a panel for improving the transmittance of an area in which an optical electronic device is disposed.

Description of the Related Art

Display devices provide functions such as an image capture function, a sensing function, and the like, as well as an image display function. Accordingly, the display device includes an optical electronic device such as a camera, a sensor for detecting an image, etc. The optical electronic device is located in an area of the display device where incident light can be advantageously received or detected. To install the increases the bezel side and requires a notch or a hole in the display panel of the display device.

SUMMARY OF THE DISCLOSURE

Accordingly, one aspect of the present disclosure is to address the above noted and other problems of the related art.

Another aspect of the present disclosure is to provide a display device with an increased display area.

Yet another aspect of the present disclosure is to provide a display device having a light transmission structure for an optical electronic device located under the display panel and not exposed in the front surface of the display device.

Still another aspect is to provide a display panel including an optical electronic device in area having a high transmittance.

Yet another aspect of the present disclosure is to provide a display device including an optical electronic device such as a camera, a sensor, and/or the like disposed under a display area, or in a lower portion, of the display panel so as not to be exposed to the front display surface.

To achieve these and other aspects, the present disclosure provides a display device including a first optical display area and a normal display area located outside of the first optical display area, and a non-display area, and including a plurality of signal lines. The first optical area includes a plurality of light emitting areas and first transmission areas, and the normal area includes the light emitting areas without including the first transmission areas. The signal lines include a plurality of first horizontal lines extending from the normal area up to the first optical area, and at least one of the plurality of first horizontal lines includes a first portion, a second portion, and a connection portion disposed between the first and second portions. Further, the connection portion extends in a direction intersecting the horizontal direction, and is located in the first optical area, for example, a portion of the first optical area adjacent to the normal area.

A display panel is also provided that includes a substrate including a display area including a first optical area at least partially overlapping a first optical electronic device located under the substrate, and a normal area located outside of the first optical area, and including a non-display area; and a plurality of signal lines including a plurality of first horizontal lines. The first optical area includes a plurality of light emitting areas and light transmission areas, and the normal area can include the light emitting areas without including the light transmission areas. One or more of the light emitting areas of the normal area and the first optical area can be disposed in a same row. The one or more light emitting areas of the normal area and the first optical area disposed in the same row also share one or more of the first horizontal lines. Each first horizontal line shared by the light emitting areas of the normal area and the first optical area include a first portion, a second portion, and a connection portion disposed between the first and second portions. The connection portion extends in a direction intersecting a horizontal direction and the connection portion is located in the first optical area, for example, a portion of the first optical area adjacent to the normal area.

In addition, a display panel and a display device is provided for reducing a non-display area and enabling an optical electronic device such as a camera, a sensor, and/or the like not to be exposed in the front surface of the display panel by disposing the optical electronic device under a display area, or in a lower portion, of the display panel.

Also, a display panel and a display device is provided that includes a first horizontal line including a connection portion disposed in an optical area, and thereby facilitating the emission of in light emitting areas and improving the transmittance in the optical area.

In addition, a display panel and a display device is provided that have a light transmission structure for enabling an optical electronic device under the display area, or in a lower portion, of the display panel to normally receive or detect light transmitting the display panel. A display panel and a display device is also provided that are capable of normally performing display driving in an optical area included in a display area of the display panel and overlapping an optical electronic device.

Additional features and an aspect will be set forth in part in the description which follows and in part will become apparent from the description or can be learned by practice of the inventive concepts provided herein. Other features and an aspect of the inventive concepts can be realized and attained by the structure particularly pointed out in, or derivable from, the written description, the claims hereof, and the appended drawings.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the appended claims. Nothing in this section should be taken as a limitation on those claims. It is to be understood that both the foregoing general description and the following detailed description of the present disclosure are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of the disclosure, illustrate an aspect of the disclosure and together with the description serve to explain principles of the disclosure. In the drawings:

FIGS. 5A and 5B are overviews illustrating arrangements of signal lines in each of a first optical area and a normal area in the display panel according to an aspect of the present disclosure;

FIGS. 5C and 5D are overviews illustrating arrangements of signal lines in each of a second optical area and a normal area in the display panel according to an aspect of the present disclosure;

FIG. 16 is a cross-sectional view taken along with line E-F of FIG. 12 according to an aspect of the present disclosure.

DETAILED DESCRIPTION OF THE EMBODIMENTS

Figure 1A:
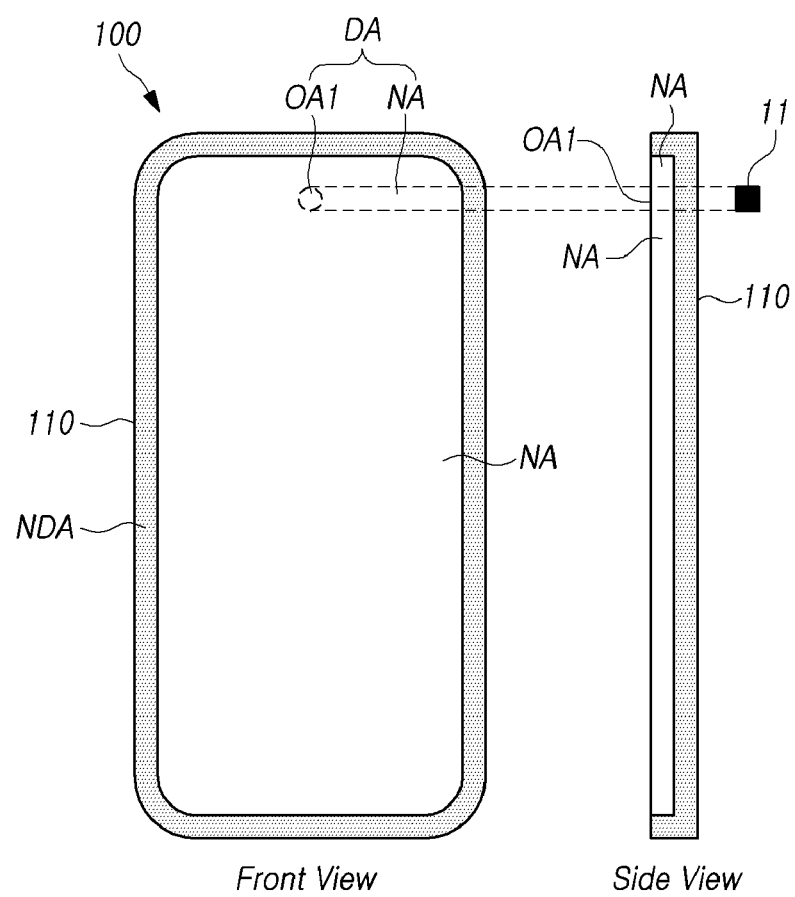
FIGS. 1A-1D are plan views illustrating a display device according to an aspect of the present disclosure.

Reference will now be made in detail to embodiments of the present disclosure, examples of which are illustrated in the accompanying drawings. In the following description, the structures, embodiments, implementations, methods and operations described herein are not limited to the specific example or examples set forth herein and can be changed as is known in the art, unless otherwise specified. Names of the respective elements used in the following explanations are selected only for convenience of writing the specification and may thus be different from those used in actual products.

The shapes, sizes, ratios, angles, numbers, and the like, which are illustrated in the drawings to describe various example embodiments of the present disclosure, are merely given by way of example. Therefore, the present disclosure is not limited to the illustrations in the drawings. Like reference numerals designate like elements throughout, unless otherwise specified. Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure can be sufficiently thorough and complete to assist those skilled in the art to fully understand the scope of the present disclosure. Further, the protected scope of the present disclosure is defined by claims and their equivalents. In the following description, where the detailed description of the relevant known function or configuration may unnecessarily obscure an aspect of the present disclosure, a detailed description of such known function or configuration can be omitted. Where the terms "comprise," "have," "include," "contain," "constitute," "make up of," "formed of," and the like are used, one or more other elements can be added unless the term, such as "only," is used. An element described in the singular form is intended to include a plurality of elements, and vice versa, unless the context clearly indicates otherwise. Singular forms used herein are intended to include plural forms unless the context clearly indicates otherwise. In construing an element, the element is to be construed as including an error or tolerance range even where no explicit description of such an error or tolerance range is provided.

Where positional relationships are described, for example, where the positional relationship between two parts is described using "on," "over," "under," "above," "below," "beside," "next," or the like, one or more other parts can be located between the two parts unless a more limiting term, such as "immediate(ly)," "direct(ly)," or "close(ly)" is used. For example, where an element or layer is disposed "on" another element or layer, a third element or layer can be interposed therebetween. Furthermore, the terms "left," "right," "top," "bottom," "downward," "upward," "upper," "lower," and the like refer to an arbitrary frame of reference. Time relative terms, such as "after", "subsequent to", "next to", "before", or the like, used to describe a temporal relationship between events, operations, or the like are generally intended to include events, situations, cases, operations, or the like that do not occur consecutively unless the terms, such as "directly", "immediately", or the like, are used.

In describing a temporal relationship, when the temporal order is described as, for example, "after," "subsequent," "next," or "before," a case which is not continuous can be included unless a more limiting term, such as "just," "immediate(ly)," or "direct(ly)," is used. When signal flows are discussed, for example, the transmission of a signal from node A to node B can include the transmission of the signal from node A to node B by way of another node unless 'direct' or 'directly' is used.

Although the terms "first," "second," A, B, (a), (b), and the like can be used herein to describe various elements, these elements should not be interpreted to be limited by these terms as they are not used to define a particular order or precedence. These terms are merely used herein for distinguishing an element from other elements. The expression of a first element, a second elements "and/or" a third element should be understood as one of the first, second and third elements or as any or all combinations of the first, second and third elements.

By way of example, A, B and/or C can refer to only A, only B, or only C; any or some combination of A, B, and C; or all of A, B, and C. Therefore, a first element mentioned below can be a second element in a technical concept of the present disclosure. Further, the term "may" fully encompasses all the meanings of the term "can." The term "at least one" should be understood as including any or all combinations of one or more of the associated listed items. For example, the meaning of "at least one of a first element, a second element, and a third element" encompasses the combination of all three listed elements, combinations of any two of the three elements, as well as each individual element, the first element, the second element, and the third element.

Hereinafter, with reference to the accompanying drawings, various embodiments of the present disclosure will be described in detail. In particular, FIGS. 1A-1D are plan views illustrating a display device 100 according to an aspect of the present disclosure.

Referring to FIGS. 1A-1D, the display device 100 includes a display panel 110 for displaying images, and optical electronic devices 11 and/or 12. As shown, the display panel 110 includes a display area DA in which an image is displayed and a non-display area NDA in which an image is not displayed. A plurality of subpixels are also arranged in the display area DA, and several types of signal lines for driving the plurality of subpixels are arranged therein.

The non-display area NDA refers to an area outside of the display area DA. Further, several types of signal lines can be arranged in the non-display area NDA, and several types of driving circuits can be connected thereto. At least a portion of the non-display area NDA can be bent to be invisible from the front of the display panel or can be covered by a case of the display panel 110 or the display device 100. The non-display area NDA can be also referred to as a bezel or a bezel area.

Referring to FIGS. 1A-1D, optical electronic devices 11 and/or 12 are located under, or in a lower portion of, the display panel 110 (an opposite side to the viewing surface thereof). Light can thus enter the front surface (viewing surface) of the display panel 110, pass through the display panel 110, and reach optical electronic devices 11 and/or 12 located under, or in the lower portion of, the display panel 110 (the opposite side of the viewing surface).

The optical electronic devices 11 and/or 12 can receive or detect light transmitting through the display panel 110 and perform a predefined function based on the received light. For example, the optical electronic devices 11 and/or 12 can include an image capture device such as a camera (an image sensor), and/or the like, or a sensor such as a proximity sensor, an illuminance sensor, etc.

Referring to FIGS. 1A-1D, the display area DA includes optical areas OA1 and/or OA2 and a normal area NA. Herein, the term "normal area" NA is an area that while being provided in the display area DA, does not overlap with the optical electronic devices 11 and/or 12 and can also be referred to as a non-optical area. In addition, the optical areas OA1 and/or OA2 are one or more areas overlapping the optical electronic devices 11 and/or 12. According to the example in FIG. 1A, the display area DA includes a first optical area OA1 and a normal area NA. In this example, at least a portion of the first optical area OA1 overlaps a first optical electronic device 11.

Figure 1B:
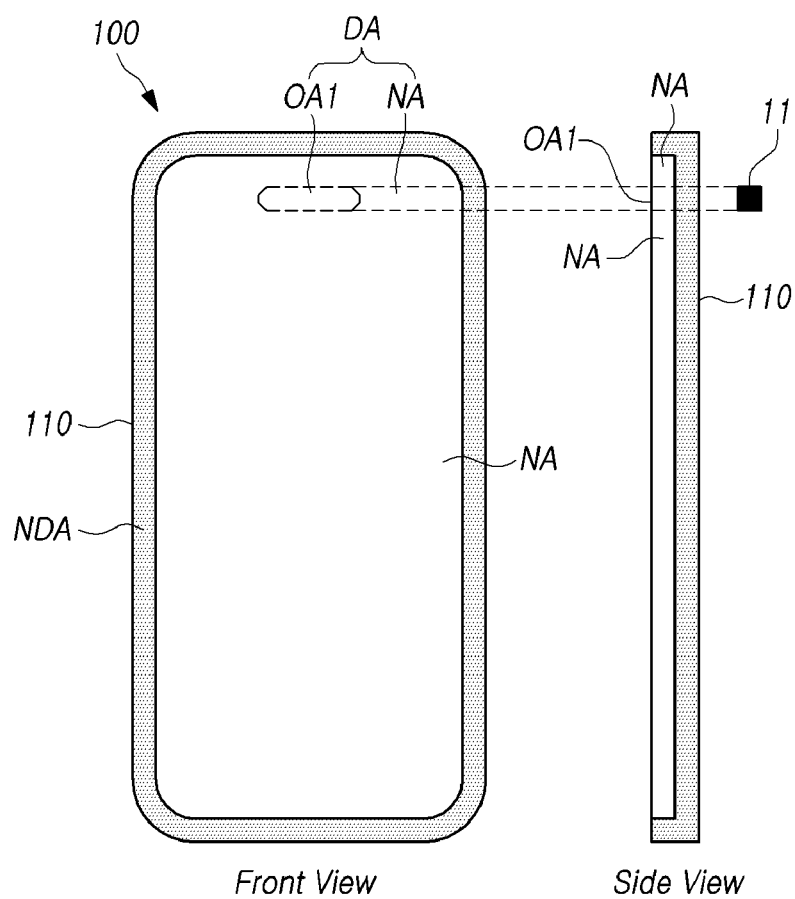

Although FIG. 1A illustrates the first optical area OA1 has a circular shape, the shape of the first optical area OA1 is not limited thereto. For example, as illustrated in FIG. 1B, the first optical area OA1 can have an octagonal shape, or various polygonal shapes.

Figure 1C:
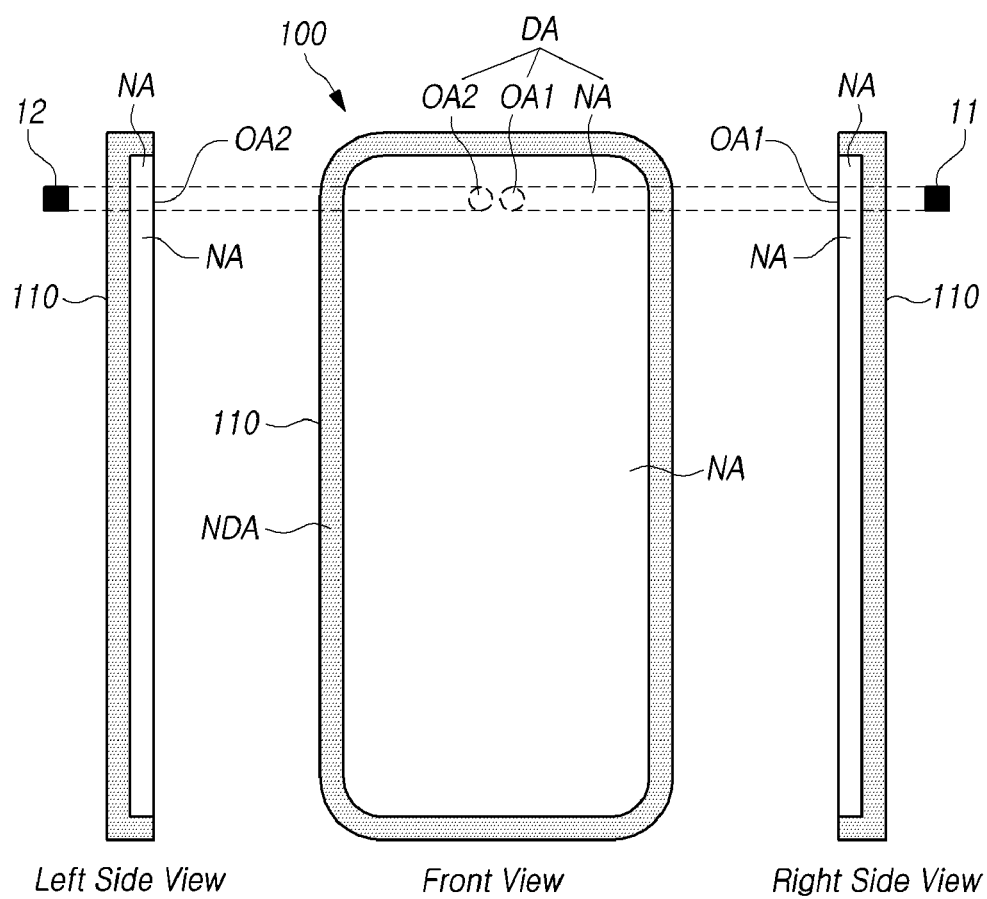

According to the example in FIG. 1C, the display area DA includes a first optical area OA1, a second optical area OA2, and a normal area NA. In FIG. 1C, at least a portion of the normal area NA is provided between the first and second optical areas OA1 and OA2. In this example, at least a portion of the first optical area OA1 can overlap the first optical electronic device 11, and at least a portion of the second optical area OA2 can overlap a second optical electronic device 12.

Figure 1D:
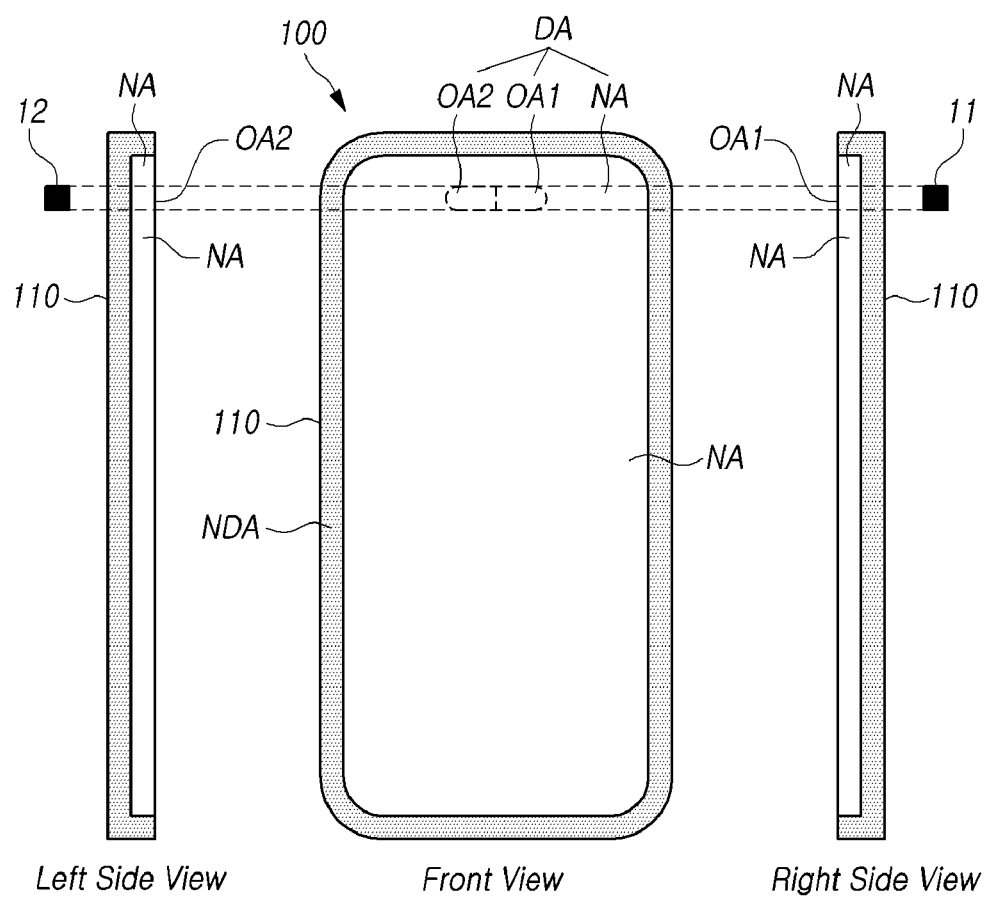

According to the example in FIG. 1D, the display area DA includes a first optical area OA1, a second optical area OA2, and a normal area NA. In the example in FIG. 1D, the normal area NA is not provided between the first and second optical areas OA1 and OA2. For example, the first and second optical areas OA1 and OA2 can contact each other (e.g., directly contact each other). In this example, at least a portion of the first optical area OA1 can overlap the first optical electronic device 11, and at least a portion of the second optical area OA2 can overlap the second optical electronic device 12.

In addition, an image display structure and a light transmission structure are preferably formed in the optical areas OA1 and/or OA2. For example, because the optical areas OA1 and/or OA2 are a portion of the display area DA, subpixels for displaying an image are included in the optical areas OA1 and/or OA2. Further, to enable light to transmit the optical electronic devices 11 and/or 12, a light transmission structure is formed in the optical areas OA1 and/or OA2.

Even though the optical electronic devices 11 and/or 12 need to receive or detect light, the optical electronic devices 11 and/or 12 can be located on the back of the display panel 110 (e.g., on an opposite side of a viewing surface). In this embodiment, the optical electronic devices 11 and/or 12 are located, for example, under, or in a lower portion of, the display panel 110, and are configured to receive light that has transmitted through the display panel 110.

For example, the optical electronic devices 11 and/or 12 are not exposed in the front surface (viewing surface) of the display panel 110. Accordingly, when a user looks at the front of the display device 100, the optical electronic devices 11 and/or 12 are not visible to the user.

Further, the first optical electronic device 11 can be a camera, and the second optical electronic device 12 can be a sensor such as a proximity sensor, an illuminance sensor, an infrared sensor, etc. For example, the camera can be a camera lens, an image sensor, or a unit including at least one of the camera lens and the image sensor. The sensor can be, for example, an infrared sensor capable of detecting infrared rays. In another embodiment, the first optical electronic device 11 can be a sensor, and the second optical electronic device 12 can be a camera.

The following description refers to the first optical electronic device 11 as a camera, and the second optical electronic device 12 as a sensor. However, the first optical electronic device 11 can be the sensor, and the second optical electronic device 12 can be the camera. As described above, the camera can be a camera lens, an image sensor, or a unit including at least one of the camera lens and the image sensor.

When the first optical electronic device 11 is a camera, the camera can be located on the back of (e.g., under, or in a lower portion of) the display panel 110, and be used as a front camera for capturing objects or images in a front direction of the display panel 110. Accordingly, the user can capture an image or object through the camera that is invisible on the viewing surface of the display panel 110.

Although the normal area NA and the optical areas OA1 and/or OA2 included in the display area DA in each of FIGS. 1A-1D are areas where images can be displayed, the light transmission structure can be omitted in the normal area NA, and only disposed in the optical areas OA1 and/or OA2 are areas where the light transmission structure need to be formed. Thus, the normal area NA is an area where a light transmission structure is not implemented or included (e.g., omitted), and the optical areas OA1 and/or OA2 are areas in which the light transmission structure is implemented or included.

Accordingly, the optical areas OA1 and/or OA2 can have a transmittance greater than or equal to a predetermined level, i.e., a relatively high transmittance, and the normal area NA has a light transmittance less than the predetermined level i.e., a relatively low transmittance. For example, the optical areas OA1 and/or OA2 can have a resolution, a subpixel arrangement structure, the number of subpixels per unit area, an electrode structure, a line structure, an electrode arrangement structure, a line arrangement structure, or/and the like different from that/those of the normal area NA.

In one embodiment, the number of subpixels per unit area in the optical areas OA1 and/or OA2 can be less than the number of subpixels per unit area in the normal area NA. For example, the resolution of the optical areas OA1 and/or OA2 can be lower than that of the normal area NA. Here, the number of subpixels per unit area includes a unit for measuring resolution, for example, referred to as pixels (or subpixels) per inch (PPI), which represents the number of pixels within 1 inch.

Also, in FIGS. 1A-1D, the number of subpixels per unit area in the first optical areas OA1 can be less than the number of subpixels per unit area in the normal area NA. In FIGS. 1C and 1D, the number of subpixels per unit area in the second optical areas OA2 can be greater than or equal to the number of subpixels per unit area in the first optical areas OA1.

Further, the first optical area OA1 can have various shapes, such as a circle, an ellipse, a quadrangle, a hexagon, an octagon or the like. In addition, the second optical area OA2 can have various shapes, such as a circle, an ellipse, a quadrangle, a hexagon, an octagon or the like. The first and second optical areas OA1 and OA2 can also have the same shape or different shapes. Referring to FIG. 1C, when the first and second optical areas OA1 and OA2 contact each other, the entire optical area including the first and second optical areas OA1 and OA2 can also have various shapes, such as a circle, an ellipse, a quadrangle, a hexagon, an octagon or the like.

Hereinafter, the description is based on embodiments in which each of the first and second optical areas OA1 and OA2 has a circular shape. However, one or both of the first and second optical areas OA1 and OA2 can have a shape other than a circular shape. In addition, as described above, the first optical electronic device 11 is located to be covered under, or in the lower portion of, the display panel 110 without being exposed to the outside. In addition, the first optical electronic device 11 is referred to as a camera. This arrangement can be referred to as an under-display camera (UDC) technology.

Also, the display device 100 according to this configuration has an advantage of increasing the size of the display area DA because a notch or a camera hole for exposing a camera need not be formed in the display panel 110. The size of the bezel area can also be reduced, and the degree of freedom in design can be improved.

Although the optical electronic devices 11 and/or 12 are located to be covered on the back of (under, or in the lower portion of) the display panel 110 in the display device 100 according to an aspect of the present disclosure, that is, hidden not to be exposed to the outside, the optical electronic devices 11 and/or 12 still need to receive or detect light for normally performing predefined functionality. Further, image display needs to be normally performed in the optical areas OA1 and/or OA2 overlapping the optical electronic devices 11 and/or 12 in the display area DA.

Figure 2:
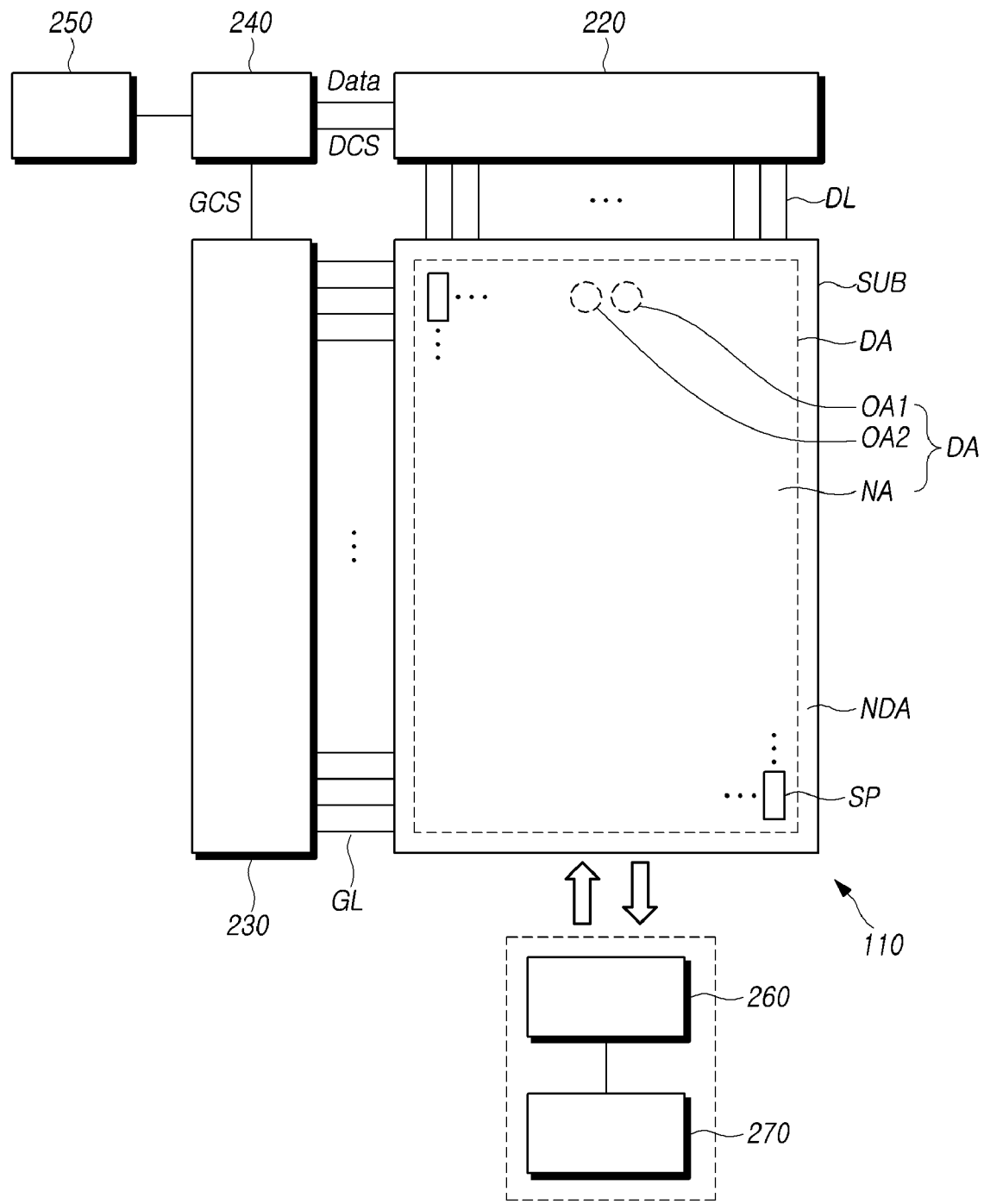
FIG. 2 is a block diagram illustrating display device according to an aspect of the present disclosure.

Next, FIG. 2 is a block diagram of the display device 100 according to an aspect of the present disclosure. Referring to FIG. 2, the display device 100 includes the display panel 110 and a display driving circuit as components for displaying an image. The display driving circuit is for driving the display panel 110, and includes a data driving circuit 220, a gate driving circuit 230, a display controller 240, and other components.

As shown, the display panel 110 includes a display area DA in which an image is displayed and a non-display area NDA in which an image is not displayed. The non-display area NDA is an area outside of the display area DA, and can also be referred to as an edge area or a bezel area. All or a portion of the non-display area NDA can be an area visible from the front surface of the display device 100, or an area that is not visible from the front surface of the display device 100 as a corresponding portion is bent.

The display panel 110 also includes a substrate SUB and a plurality of subpixels SP disposed on the substrate SUB. The display panel 110 further includes various types of signal lines to drive the subpixels SP. In addition, the display device 100 can be a liquid crystal display device or a self-emission display device in which light is emitted from the display panel 110 itself. When the display device 100 is the self-emission display device, each subpixel SP can include a light emitting element.

In one embodiment, the display device 100 can be an organic light emitting display device in which the light emitting element is implemented using an organic light emitting diode (OLED). In another embodiment, the display device 100 can be an inorganic light emitting display device in which the light emitting element is implemented using an inorganic material-based light emitting diode. In still a further embodiment, the display device 100 can be a quantum dot display device in which the light emitting element is implemented using quantum dots, which are self-emission semiconductor crystals.

In addition, the structure of each subpixel SP can vary according to types of the display devices 100. When the display device 100 is a self-emission display device including self-emission subpixels SP, each subpixel SP can include a self-emission light emitting element, and one or more transistors and capacitors. Further, the various types of signal lines arranged in the display device 100 can include, for example, a plurality of data lines DL for carrying data signals (which can be referred to as data voltages or image signals), a plurality of gate lines GL for carrying gate signals (which can be referred to as scan signals), and the like.

The data lines DL and the gate lines GL also intersect each other. Each data line DL also extends in a first direction and each gate line GL extends in a second direction. Further, the first direction can be a column or vertical direction, and the second direction can be a row or horizontal direction. In another example, the first direction can be the row direction, and the second direction can be the column direction.

In addition, the data driving circuit 220 is for driving the data lines DL, and supplying data signals to the data lines DL. The gate driving circuit 230 is for driving the gate lines GL, and supplying gate signals to the gate lines GL. The display controller 240 is for controlling the data driving circuit 220 and the gate driving circuit 230, and can control a driving timing for the data lines DL and the gate lines GL.

In addition, the display controller 240 can supply a data driving control signal DCS to the data driving circuit 220 to control the data driving circuit 220, and supply a gate driving control signal GCS to the gate driving circuit 230 to control the gate driving circuit 230. The display controller 240 can also receive input image data from a host system 250 and supply image data Data to the data driving circuit 220 based on the input image data.

In addition, the data driving circuit 220 can supply data signals to the data lines DL according to a driving timing control of the display controller 240. The data driving circuit 220 can also receive the digital image data Data from the display controller 240, convert the received image data Data into analog data signals, and supply the resulting analog data signals to the data lines DL.

Further, the gate driving circuit 230 can supply gate signals to the gate lines GL according to a timing control of the display controller 240. The gate driving circuit 230 can also receive a first gate voltage corresponding to a turn-on level voltage and a second gate voltage corresponding to a turn-off level voltage along with various gate driving control signals GCS, generate gate signals, and supply the generated gate signals to the gate lines GL.

In addition, the data driving circuit 220 can be connected to the display panel 110 in a tape automated bonding (TAB) type, or connected to a conductive pad such as a bonding pad of the display panel 110 in a chip on glass (COG) type or a chip on panel (COP) type, or connected to the display panel 110 in a chip on film (COF) type.

Also, the gate driving circuit 230 can be connected to the display panel 110 in the tape automated bonding (TAB) type, or connected to a conductive pad such as a bonding pad of the display panel 110 in the chip on glass (COG) type or the chip on panel (COP) type, or connected to the display panel 110 in the chip on film (COF) type. In another embodiment, the gate driving circuit 230 can be disposed in the non-display area NDA of the display panel 110 in a gate in panel (GIP) type. The gate driving circuit 230 can also be disposed on or over the substrate, or connected to the substrate. That is, in the case of the GIP type, the gate driving circuit 230 can be disposed in the non-display area NDA of the substrate. The gate driving circuit 230 can be connected to the substrate for the chip on glass (COG) type, the chip on film (COF) type, or the like.

In addition, at least one of the data driving circuit 220 and the gate driving circuit 230 can be disposed in the display area DA of the display panel 110. For example, at least one of the data driving circuit 220 and the gate driving circuit 230 can be disposed not to overlap subpixels SP, or disposed to be overlapped with one or more, or all, of the subpixels SP.

The data driving circuit 220 can also be located on, but not limited to, only one side or portion (e.g., an upper edge or a lower edge) of the display panel 110. In addition, the data driving circuit 220 can be located in, but not limited to, two sides or portions (e.g., an upper edge and a lower edge) of the display panel 110 or at least two of four sides or portions (e.g., the upper edge, the lower edge, a left edge, and a right edge) of the display panel 110 according to driving schemes, panel design schemes, or the like.

The gate driving circuit 230 can be located in only one side or portion (e.g., a left edge or a right edge) of the display panel 110. In addition, the gate driving circuit 230 can be connected to two sides or portions (e.g., a left edge and a right edge) of the display panel 110, or be connected to at least two of four sides or portions (e.g., an upper edge, a lower edge, the left edge, and the right edge) of the display panel 110 according to driving schemes, panel design schemes, or the like.

Further, the display controller 240 can be implemented in a separate component from the data driving circuit 220, or integrated with the data driving circuit 220 and thus implemented in an integrated circuit. The display controller 240 can also be a timing controller used in display technology or a controller or a control device for performing other control functions in addition to the general functions of the timing controller. In addition, the display controller 240 can be a controller or a control device different from the timing controller, or a circuitry or a component included in the controller or the control device. The display controller 240 can also be implemented with various circuits or electronic components such as an integrated circuit (IC), a field programmable gate array (FPGA), an application specific integrated circuit (ASIC), a processor, and/or the like.

In addition, the display controller 240 can be mounted on a printed circuit board, a flexible printed circuit, and/or the like and be electrically connected to the gate driving circuit 230 and the data driving circuit 220 through the printed circuit board, flexible printed circuit, and/or the like. The display controller 240 can transmit signals to, and receive signals from, the data driving circuit 220 via one or more predefined interfaces including, for example, a low voltage differential signaling (LVDS) interface, an embedded clock point-point interface (EPI), a serial peripheral interface (SPI), and the like.

In addition, to further provide a touch sensing function, as well as an image display function, the display device 100 can include at least one touch sensor, and a touch sensing circuit capable of detecting whether a touch event occurs by a touch object such as a finger, a pen, or the like, or of detecting a corresponding touch position, by sensing the touch sensor. The touch sensing circuit can include a touch driving circuit 260 for generating and providing touch sensing data by driving and sensing the touch sensor, a touch controller 270 for detecting the occurrence of a touch event or detecting a touch position using the touch sensing data, and one or more other components.

The touch sensor can also include a plurality of touch electrodes and a plurality of touch lines for electrically connecting the touch electrodes to the touch driving circuit 260. The touch sensor can be implemented in a touch panel outside of the display panel 110 or be implemented inside of the display panel 110. The touch sensor implemented outside of the display panel 110 is referred to as an add-on type. In particular, the touch panel and the display panel 110 can be separately manufactured and coupled during an assembly process. The add-on type of touch panel can also include a touch panel substrate and a plurality of touch electrodes on the touch panel substrate.

When the touch sensor is implemented inside of the display panel 110, a process of manufacturing the display panel 110 includes disposing the touch sensor over the substrate SUB together with signal lines and electrodes related to driving the display device 100. The touch driving circuit 260 can supply a touch driving signal to at least one of the touch electrodes, and sense at least one of the touch electrodes to generate touch sensing data.

Further, the touch sensing circuit can perform touch sensing using a self-capacitance sensing technique or a mutual-capacitance sensing technique. When the touch sensing circuit performs touch sensing in the self-capacitance sensing technique, the touch sensing circuit can perform touch sensing based on capacitance between each touch electrode and a touch object (e.g., a finger, a pen, and the like).

According to the self-capacitance sensing method, each touch electrode can serve as both a driving touch electrode and a sensing touch electrode. The touch driving circuit 260 can also drive all, or one or more, of the touch electrodes and sense all, or one or more, of the touch electrodes. When the touch sensing circuit performs touch sensing in the mutual-capacitance sensing technique, the touch sensing circuit can perform touch sensing based on capacitance between touch electrodes.

According to the mutual-capacitance sensing method, the touch electrodes are divided into driving touch electrodes and sensing touch electrodes. The touch driving circuit 260 can drive the driving touch electrodes and sense the sensing touch electrodes. The touch driving circuit 260 and the touch controller 270 included in the touch sensing circuit can be implemented in separate devices or in a single device. Further, the touch driving circuit 260 and the data driving circuit 220 can be implemented in separate devices or in a single device.

The display device 100 further includes a power supply circuit for supplying various types of power to the display driving circuit and/or the touch sensing circuit. In addition, the display device 100 can be a mobile terminal such as a smart phone, a tablet, or the like, or a monitor, a television (TV), or the like. Such devices can be of various types, sizes, and shapes. The display device 100 according to embodiments of the present disclosure are not limited thereto, and includes displays of various types, sizes, and shapes for displaying information or images.

As described above, the display area DA of the display panel 110 can include a normal area NA and optical areas OA1 and/or OA2, for example, as illustrated in FIGS. 1A-1D. The normal area NA and the optical areas OA1 and/or OA2 are areas where an image can be displayed. However, the light transmission structure can be omitted in the normal area NA, and provided only in the optical areas OA1 and/or OA2.

In addition, the following description assumes the display area DA includes first and second optical areas OA1 and OA2 and the normal area NA.

Figure 3:
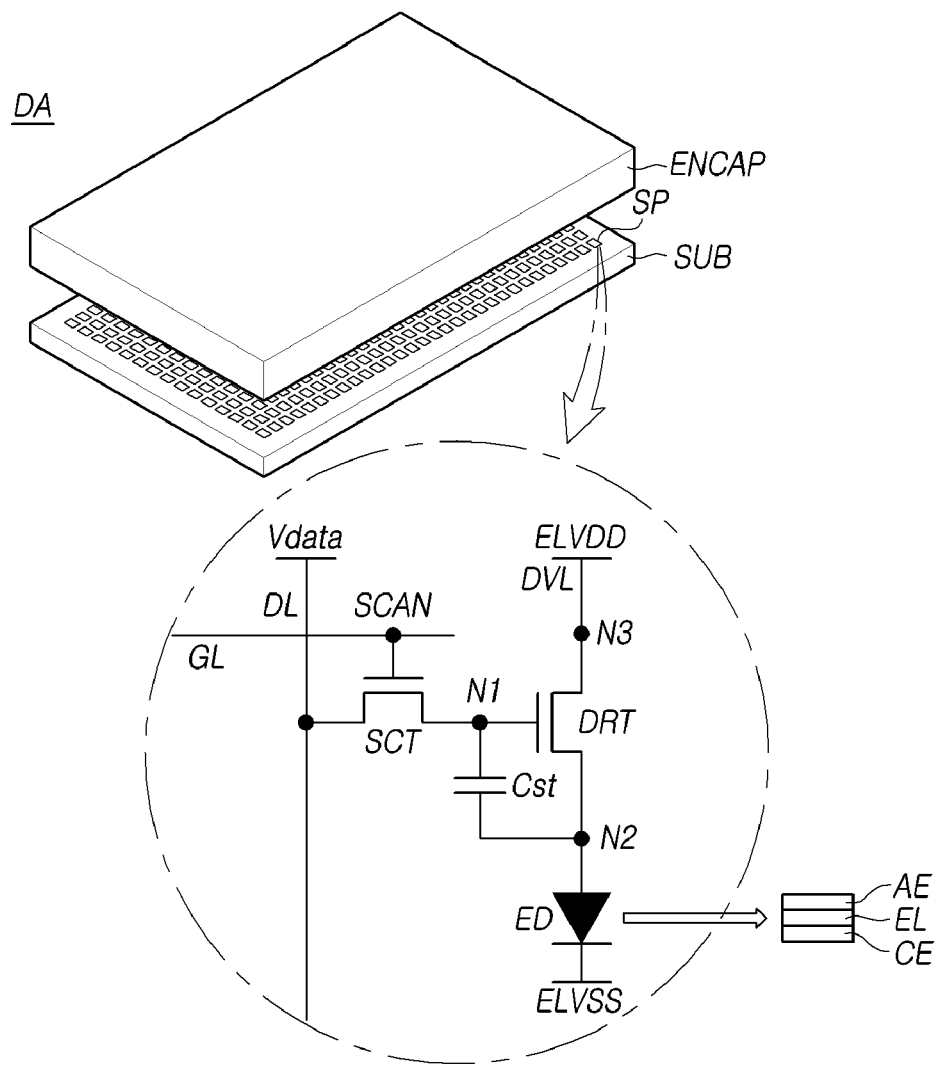
FIG. 3 is an overview illustrating an equivalent circuit of a subpixel in a display panel according to an aspect of the present disclosure.

Next, FIG. 3 is an overview illustrating an equivalent circuit of a subpixel SP in the display panel 110 according to an aspect of the present disclosure. Each subpixel SP disposed in the normal area NA, the first optical area OA1, and the second optical area OA2 included in the display area DA of the display panel 110 can include a light emitting element ED, a driving transistor DRT for driving the light emitting element ED, a scan transistor SCT for transmitting a data voltage Vdata to a first node N1 of the driving transistor DRT, a storage capacitor Cst for maintaining a voltage at an approximate constant level during one frame, and the like.

The driving transistor DRT includes the first node N1 to which a data voltage is applied, a second node N2 electrically connected to the light emitting element ED, and a third node N3 to which a driving voltage ELVDD through a driving voltage line DVL is applied. In the driving transistor DRT, the first node N1 can be a gate node, the second node N2 can be a source node or a drain node, and the third node N3 can be the drain node or the source node.

Further, the light emitting element ED includes an anode electrode AE, an emission layer EL, and a cathode electrode CE. The anode electrode AE can be a pixel electrode disposed in each subpixel SP, and can be electrically connected to the second node N2 of the driving transistor DRT of each subpixel SP. The cathode electrode CE can be a common electrode commonly disposed in the subpixels SP, and a base voltage ELVSS such as a low-level voltage can be applied to the cathode electrode CE.

In one example, the anode electrode AE can be the pixel electrode, and the cathode electrode CE can be the common electrode. In another example, the anode electrode AE can be the common electrode, and the cathode electrode CE can be the pixel electrode. The following description assumes the anode electrode AE is the pixel electrode, and the cathode electrode CE is the common electrode unless explicitly stated otherwise.

In addition, the light emitting element ED can be, for example, an organic light emitting diode (OLED), an inorganic light emitting diode, a quantum dot light emitting element, or the like. When an organic light emitting diode is used as the light emitting element ED, the emission layer EL included in the light emitting element ED can include an organic emission layer including an organic material.

Further, the scan transistor SCT can be turned on and off by a scan signal SCAN that is a gate signal applied through a gate line GL, and be electrically connected between the first node N1 of the driving transistor DRT and a data line DL. The storage capacitor Cst can also be electrically connected between the first node N1 and the second node N2 of the driving transistor DRT.

In addition, each subpixel SP can include two transistors (2T: DRT and SCT) and one capacitor (1C: Cst) (which can be referred to as a "2T1C structure") as illustrated in FIG. 3, and in some instance, can further include one or more transistors or capacitors. In addition, the storage capacitor Cst, which is provided between the first node N1 and the second node N2 of the driving transistor DRT, can be an external capacitor intentionally configured or designed to be located outside of the driving transistor DRT, other than internal capacitors, such as parasitic capacitors (e.g., a gate-to-source capacitance Cgs, a gate-to-drain capacitance Cgd, and the like).

Each of the driving transistor DRT and the scan transistor SCT can be an n-type transistor or a p-type transistor. Because circuit elements (e.g., in particular, a light emitting element ED) in each subpixel SP are vulnerable to external moisture or oxygen, an encapsulation layer ENCAP can be disposed in the display panel 110 to prevent the external moisture or oxygen from penetrating into the circuit elements (e.g., in particular, the light emitting element ED). The encapsulation layer ENCAP can be disposed to cover the light emitting element ED.

Figure 4:
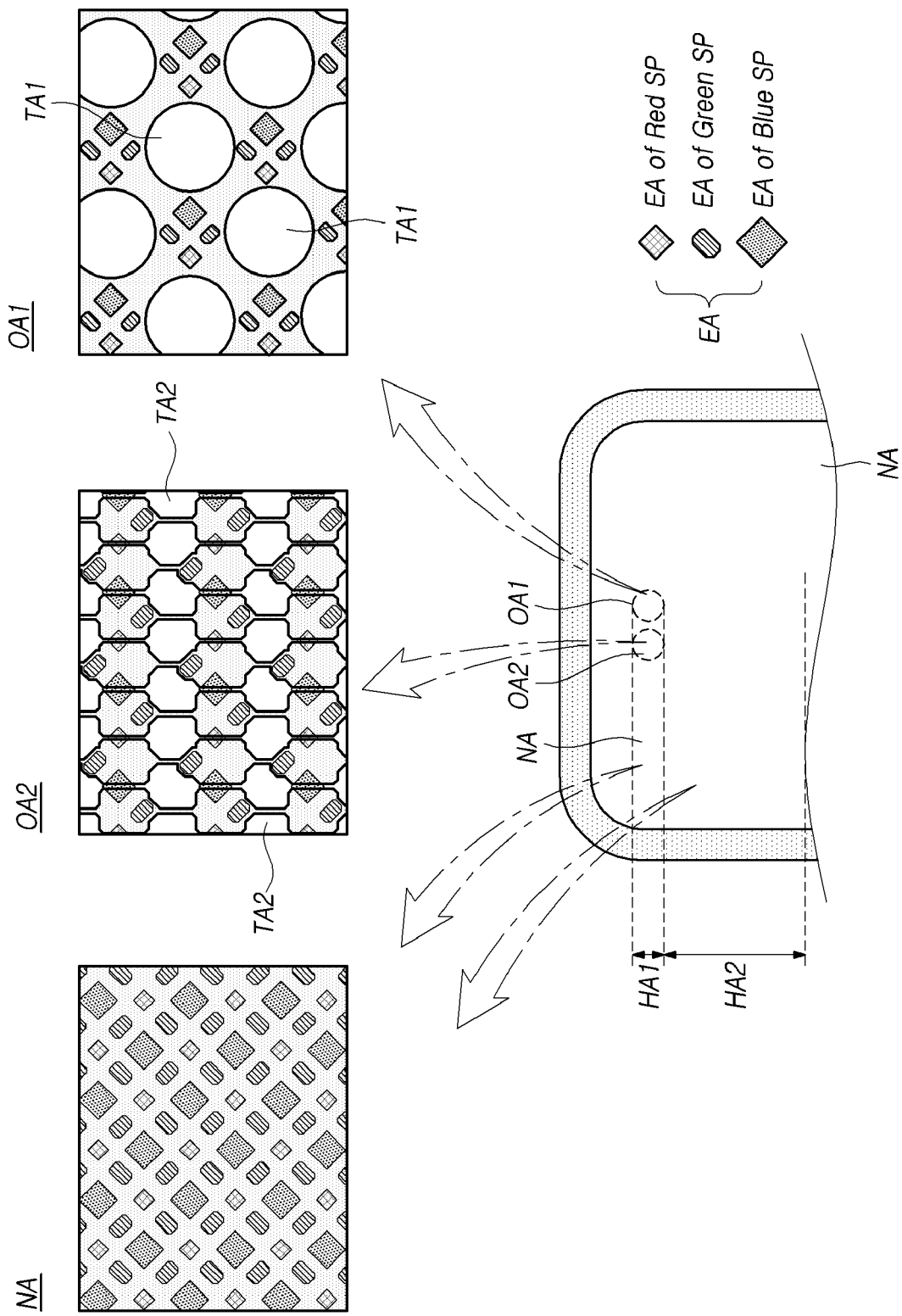
FIG. 4 is an overview illustrating arrangements of subpixels in three areas included in a display area of the display panel according to an aspect of the present disclosure.

Next, FIG. 4 is an overview illustrating arrangements of subpixels SP in the three areas (NA, OA1, and OA2) included in the display area DA of the display panel 110 according to an aspect of the present disclosure. Referring to FIG. 4, a plurality of subpixels SP are disposed in each of the normal area NA, the first optical area OA1, and the second optical area OA2 included in the display area DA.

The subpixels SP can include, for example, a red subpixel (Red SP) emitting red light, a green subpixel (Green SP) emitting green light, and a blue subpixel (Blue SP) emitting blue light. Accordingly, the normal area NA, the first optical area OA1, and the second optical area OA2 can include light emitting areas EA of red subpixels (Red SP), light emitting areas EA of green subpixels (Green SP), and light emitting areas EA of blue subpixels (Blue SP).

Referring to FIG. 4, the normal area NA does not include a light transmission structure, but does include light emitting areas EA. In contrast, the first and second optical areas OA1 and OA2 include both the light emitting areas EA and the light transmission structure.

As shown in FIG. 4, the first optical area OA1 can include light emitting areas EA and first transmission areas TA1, and the second optical area OA2 can include light emitting areas EA and second transmission areas TA2. The light emitting areas EA and the transmission areas TA1 and/or TA2 can be distinct according to whether the transmission of light is allowed. For example, the light emitting areas EA can be areas not allowing light to transmit (e.g., not allowing light to transmit to the back of the display panel), and the transmission areas TA1 and/or TA2 can be areas allowing light to transmit (e.g., allowing light to transmit to the back of the display panel).

The light emitting areas EA and the transmission areas TA1 and/or TA2 can be also distinct according to whether or not a specific metal layer is included. For example, the cathode electrode CE as illustrated in FIG. 3 can be disposed in the light emitting areas EA, and the cathode electrode CE may not be disposed in the transmission areas TA1 and/or TA2. In addition, a light shield layer can be disposed in the light emitting areas EA, and not be disposed in the transmission areas TA1 and/or TA2.

Because the first optical area OA1 includes the first transmission areas TA1 and the second optical area OA2 includes the second transmission areas TA2, both of the first and second optical areas OA1 and OA2 are areas through which light can transmit. In one embodiment, a transmittance (a degree of transmission) of the first optical area OA1 and a transmittance (a degree of transmission) of the second optical area OA2 can be substantially equal.

For example, the first transmission area TA1 of the first optical area OA1 and the second transmission area TA2 of the second optical area OA2 can have substantially the same shape or size. In another example, even when the first and second transmission areas TA1 and TA2 have different shapes or sizes, a ratio of the first transmission area TA1 to the first optical area OA1 and a ratio of the second transmission area TA2 to the second optical area OA2 can be substantially equal. In one example, each of the first transmission areas TA1s has the same shape and size, and each of the second transmission areas TA2s has the same shape and size.

In another embodiment, a transmittance (a degree of transmission) of the first and second optical areas OA1 and OA2 can be different. For example, the first transmission area TA1 of the first optical area OA1 and the second transmission area TA2 of the second optical area OA2 can have different shapes or sizes. In another example, even when the first and second transmission areas TA1 and TA2 have substantially the same shape or size, a ratio of the first transmission area TA1 to the first optical area OA1 and a ratio of the second transmission area TA2 to the second optical area OA2 can be different from each other.

For example, when the first optical electronic device 11 overlaps with the first optical area OA1 is a camera, and the second optical electronic device 12 overlaps with the second optical area OA2 is a sensor for detecting images, the camera may need a greater amount of light than the sensor. Thus, the transmittance (degree of transmission) of the first optical area OA1 can be greater than the transmittance (degree of transmission) of the second optical area OA2.

For example, the first transmission area TA1 can have a size greater than the second transmission area TA2. In another example, even when the first and second transmission areas TA1 and TA2 have substantially the same size, a ratio of the first transmission area TA1 to the first optical area OA1 can be greater than a ratio of the second transmission area TA2 to the second optical area OA2.

The following description is provided based on the embodiment in which the transmittance (degree of transmission) of the first optical area OA1 is greater than the transmittance (degree of transmission) of the second optical area OA2. Further, the transmission areas TA1 and/or TA2 as illustrated in FIG. 4 can be referred to as transparent areas, and the term transmittance can be referred to as transparency.

In addition, the following description assumes the first and second optical areas OA1 and OA2 are located in an upper edge of the display area DA of the display panel 110, and are disposed adjacent to each other in left and right directions in which the upper edge extends, as illustrated in FIG. 4, unless explicitly stated otherwise.

Referring to FIG. 4, a horizontal display area in which the first and second optical areas OA1 and OA2 are disposed is referred to as a first horizontal display area HA1, and another horizontal display area in which the first and second optical areas OA1 and OA2 are not disposed is referred to as a second horizontal display area HA2. Referring to FIG. 4, the first horizontal display area HA1 can include a portion of the normal area NA, the first optical area OA1, and the second optical area OA2. The second horizontal display area HA2 includes another portion of the normal area NA.

Figure 5B:
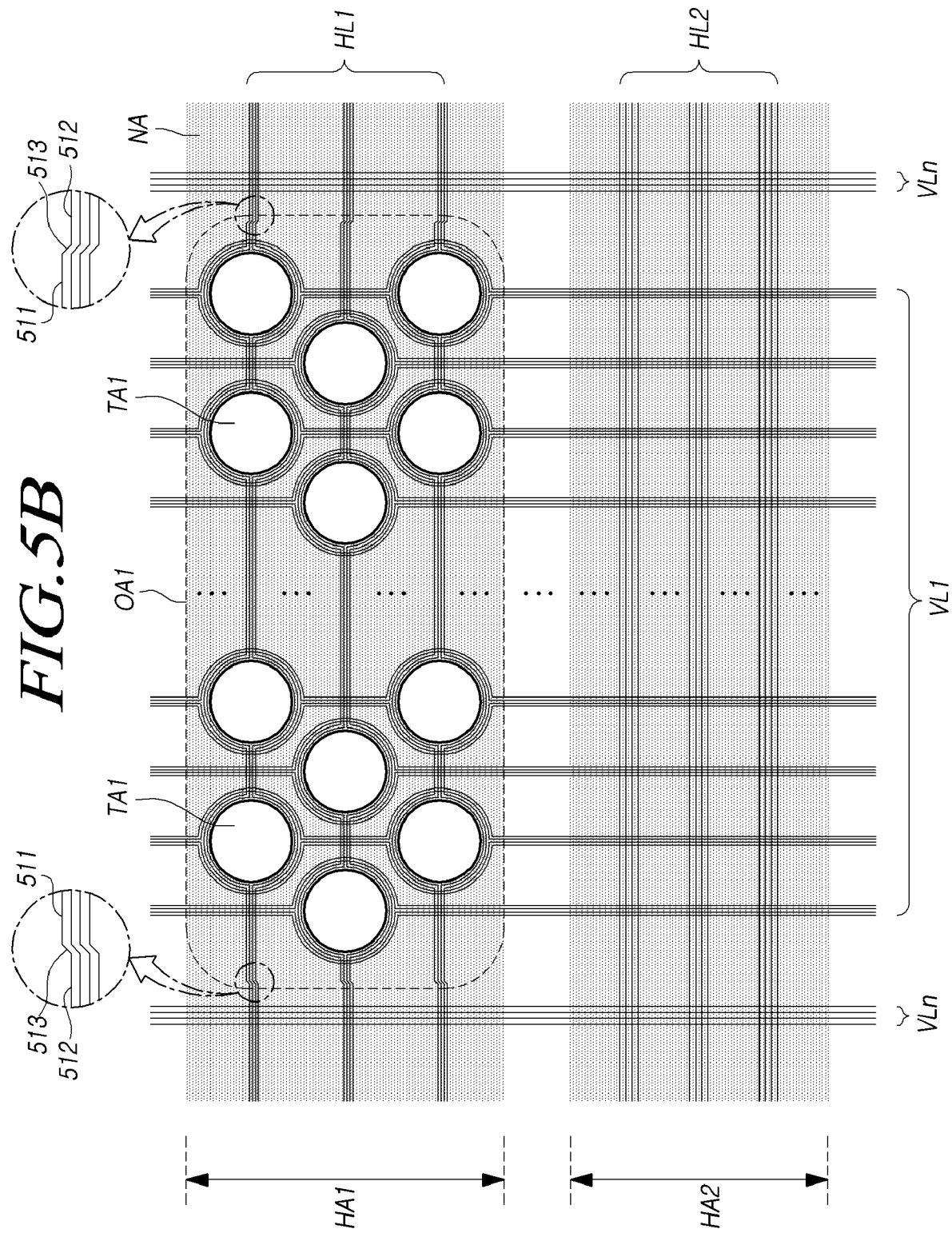

Next, FIGS. 5A and 5B are overviews illustrating arrangements of signal lines in a first optical area OA1 and a normal area NA of the display panel 110 according to an aspect of the present disclosure. In addition, FIGS. 5C and 5D are overviews illustrating arrangements of signal lines in a second optical area OA2 and the normal area NA of the display panel 110 according to an aspect of the present disclosure.

A first horizontal display area HA1 shown in FIGS. 5A-5D is a portion of a first horizontal display area (e.g., the first horizontal display area HA1 of FIG. 4) of the display panel 110, and a second horizontal display area HA2 is a portion of a second horizontal display area (e.g., the second horizontal display area HA2 of FIG. 4) of the display panel 110. The first optical area OA1 shown in FIGS. 5A and 5B is a portion of a first optical area (e.g., the first optical area OA1) of the display panel 110, and the second optical area OA2 shown in FIGS. 5C and 5D is a portion of a second optical area (e.g., the second optical area OA2) of the display panel 110.

Referring to FIGS. 5A-5D, the first horizontal display area HA1 includes a portion of the normal area NA, the first optical area OA1, and the second optical area OA2. Also, the second horizontal display area HA2 includes another portion of the normal area NA. Various types of horizontal lines (HL1 and HL2) and vertical lines (VLn, VL1, and VL2) can also be disposed in the display panel 110.

In addition, the term "horizontal" and the term "vertical" are used to refer to two directions intersecting the display panel; however, the horizontal and vertical direction can be changed depending on a viewing direction. The horizontal direction refers to, for example, a direction in which one gate line GL extends, and the vertical direction refers to, for example, a direction in which one data line DL extends. As such, the term horizontal and the term vertical are used to represent two directions.

Referring to FIGS. 5A-5D, the horizontal lines disposed in the display panel 110 can include first horizontal lines HL1 disposed in the first horizontal display area HA1 and second horizontal lines HL2 disposed in the second horizontal display area HA2. The first horizontal lines HL1 and the second horizontal lines HL2 can be the gate lines GL.

Also, the gate lines GL can include various types of gate lines according to structures of one or more subpixels SP.

Referring to FIGS. 5A-5D, the vertical lines disposed in the display panel 110 can include normal vertical lines VLn disposed only in the normal area NA, first vertical lines VL1 running through both of the first optical area OA1 and the normal area NA, and second vertical lines VL2 running through both of the second optical area OA2 and the normal area NA. The vertical lines disposed in the display panel 110 can include data lines DL, driving voltage lines DVL, and the like, and may further include reference voltage lines, initialization voltage lines, etc. That is, the normal vertical lines VLn, the first vertical lines VL1 and the second vertical lines VL2 can include data lines DL, driving voltage lines DVL, etc., and further include reference voltage lines, initialization voltage lines, and the like.

In addition, the term "horizontal" in the second horizontal line HL2 can mean only that a signal is carried from a left side to a right side of the display panel (or from the right side to the left side), and not mean that the second horizontal line HL2 runs in a straight line only in the direct horizontal direction. For example, in FIGS. 5A-5D, although the second horizontal lines HL2 are illustrated in a straight line, the second horizontal lines HL2 can include bent or folded portions that are different from the configurations shown in FIGS. 5A-5D. Likewise, the first horizontal lines HL1 may also include bent or folded portions.

In addition, the term "vertical" in the normal vertical line VLn can mean only that a signal is carried from an upper portion to a lower portion of the display panel (or from the lower portion to the upper portion), and not mean that the normal vertical line VLn runs in a straight line only in the direct vertical direction. For example, in FIGS. 5A-5D, although the normal vertical lines VLn are illustrated in a straight line, the normal vertical lines VLn can include bent or folded portions that are different from the configurations shown in FIGS. 5A-5D. Likewise, the first vertical lines VL1 and the second vertical lines VL2 can also include bent or folded portions.

Referring to FIGS. 5A and 5B, the first optical area OA1 included in the first horizontal display area HA1 includes both light emitting areas EA and first transmission areas TA1. In the first optical area OA1, respective outer areas of the first transmission areas TA1 can be included in the light emitting areas EA.

To improve the transmittance of the first optical area OA1, the first horizontal lines HL1 can run through the first optical area OA1 while avoiding the first transmission areas TA1. Accordingly, each first horizontal line HL1 running through the first optical area OA1 includes curved or bent portions running around respective outer edges of the first transmission areas TA1.

Also, the first horizontal lines HL1 disposed in the first horizontal display area HA1 and the second horizontal lines HL2 disposed in the second horizontal display area HA2 can have different shapes or lengths. For example, the first horizontal lines HL1 running through the first optical area OA1 and the second horizontal lines HL2 not running through the first optical area OA1 can have different shapes or lengths.

Further, to improve the transmittance of the first optical area OA1, the first vertical lines VL1 can run through the first optical area OA1 while avoiding the first transmission areas TA1. Accordingly, the first vertical lines VL1 running through the first optical area OA1 can include curved or bent portions running around respective outer edges of the first transmission areas TA1. Thus, the first vertical lines VL1 running through the first optical area OA1 and the normal vertical lines VLn disposed in the normal area NA without running through the first optical area OA1 can have different shapes or lengths.

Referring to FIGS. 5A and 5B, the first transmission areas TA1 included in the first optical area OA1 in the first horizontal display area HA1 can be arranged in a diagonal direction. In addition, in the first optical area OA1, one or more light emitting areas EA can be disposed between two first transmission areas TA1 adjacent to each other in left and right directions (e.g., two horizontally-adjacent first transmission areas TA1). Also, in the first optical area OA1 in the first horizontal display area HA1, one or more light emitting areas EA can be disposed between two first transmission areas TA1 adjacent to each other in up and down directions (e.g., two vertically-adjacent first transmission areas TA1).

Referring to FIGS. 5A and 5B, each of the first horizontal lines HL1 disposed in the first horizontal display area HA1 (e.g., each of the first horizontal lines HL1 running through the first optical area OA1) can include curved or bent portions running around respective outer edges of the first transmission areas TA1. Referring to FIGS. 5C and 5D, the second optical area OA2 included in the first horizontal display area HA1 can include light emitting areas EA and second transmission areas TA2. In the second optical area OA2, respective outer areas of the second transmission areas TA2 can be included in the light emitting areas EA.

In addition, the light emitting areas EA and the second transmission areas TA2 in the second optical area OA2 can have substantially the same locations and arrangements as the light emitting areas EA and the first transmission areas TA1 in the first optical area OA1 of FIGS. 5A and 5B. In another embodiment, as illustrated in FIGS. 5C and 5D, the light emitting areas EA and the second transmission areas TA2 in the second optical area OA2 can have locations and arrangements different from the light emitting areas EA and the first transmission areas TA1 in the first optical area OA1 of FIGS. 5A and 5B.

For example, referring to FIGS. 5C and 5D, the second transmission areas TA2 in the second optical area OA2 can be arranged in left and right directions (e.g., the horizontal direction). In this example, a light emitting area EA is not disposed between two second transmission areas TA2 adjacent to each other in left and right directions (e.g., the horizontal direction). Further, one or more of the light emitting areas EA in the second optical area OA2 can be disposed between second transmission areas TA2 adjacent to each other in up and down directions (e.g., the vertical direction). For example, one or more light emitting areas EA can be disposed between two rows of second transmission areas.

When in the first horizontal display area HA1, the first horizontal lines HL1 run through the second optical area OA2 and the normal area NA adjacent to the second optical area OA2, in one embodiment, the first horizontal lines HL1 can have substantially the same arrangement as the first horizontal lines HL1 of FIG. 5A. In another embodiment, as illustrated in FIGS. 5C and 5D, when in the first horizontal display area HA1, the first horizontal lines HL1 run through the second optical area OA2 and the normal area NA adjacent to the second optical area OA2, and the first horizontal lines HL1 can have an arrangement different from the first horizontal lines HL1 of FIGS. 5A and 5B.

This is because locations and arrangements of light emitting areas EA and second transmission areas TA2 in the second optical area OA2 of FIGS. 5C and 5D and locations and arrangements of light emitting areas EA and first transmission areas TA1 in the first optical area OA1 of FIGS. 5A and 5B are different from each other.

Referring to FIGS. 5C and 5D, when in the first horizontal display area HA1, the first horizontal lines HL1 run between second transmission areas TA2 adjacent to each other (e.g., vertically-adjacent second transmission areas TA2) in a straight line without having a curved or bent portion. For example, one first horizontal line HL1 can have curved or bent portions in the first optical area OA1, and not have a curved or bent portion in the second optical area OA2. To improve the transmittance of the second optical area OA2, the second vertical lines VL2 can run through the second optical area OA2 while avoiding the second transmission areas TA2 in the second optical area OA2.

Accordingly, each of the second vertical lines VL2 running through the second optical area OA2 can include curved or bent portions running around respective outer edges of the second transmission areas TA2. Thus, the second vertical lines VL2 running through the second optical area OA2 and the normal vertical lines VLn disposed in the normal area NA without running through the second optical area OA2 can have different shapes or lengths.

As described above, referring to FIGS. 5A-5D, the first horizontal line HL1 disposed in the first horizontal display area HA1 can include at least one portion extending in a direction other than the horizontal direction in at least one boundary area between the normal area NA and the first optical area OA1. For example, as illustrated in FIGS. 5A-5D, one or more first horizontal line HL1 can include a first portion 511, a second portion 512, and a connection portion 513.

In more detail, the first portion 511, the second portion 512, and the connection portion 513 can be integrally formed. Further, the connection portion 513 is located between the first portion 511 and the second portion 512. As shown, the first portion 511 and the second portion 512 can extend in the same direction, and extend, for example, in the horizontal direction.

The connection portion 513 extends in a direction intersecting the horizontal direction. For example, as illustrated in FIGS. 5A and 5C, the connection portion 513 can extend in a direction inclined or angled in a range of angles greater than or equal to −90° and less than 0° relative to the horizontal direction. The structure of the connection portion 513 according to embodiments of the present disclosure is not limited thereto. For example, as illustrated in FIGS. 5B and 5D, the connection portion 513 can extend in a direction inclined or angled in a range of angles greater than 0° and less than or equal to 90° relative to the horizontal direction.

As illustrated in FIGS. 5A-5D, the first horizontal lines HL1 running through the first optical area OA1 can have curved or bent portions running around respective outer edges of the first transmission areas TA1. Accordingly, a length of the first horizontal line HL1 running through the first and second optical areas OA1 and OA2 can be slightly longer than a length of the second horizontal line HL2 disposed only in the normal area NA without running through the first and second optical areas OA1 and OA2.

Accordingly, a resistance of the first horizontal line HL1 running through the first and second optical areas OA1 and OA2, which is referred to as a first resistance, can be slightly greater than a resistance of the second horizontal line HL2 disposed only in the normal area NA without running through the first and second optical areas OA1 and OA2, which is referred to as a second resistance.

Referring to FIGS. 5A-5D, because the first optical area OA1 at least partially overlaps a first optical electronic device 11 and includes first transmission areas TA1, and the second optical area OA2 least partially overlaps a second optical electronic device 12 and includes second transmission areas TA2, the first and second optical areas OA1 and OA2 can have less subpixels per unit area less than the normal area NA.

Accordingly, the number of subpixels connected to the first horizontal lines HL1 running through the first and second optical areas OA1 and OA2 can be different from the number of subpixels connected to the second horizontal lines HL2 disposed only in the normal area NA without running through the first and second optical areas OA1 and OA2. In addition, the number of subpixels connected to the first horizontal lines HL1 running through the first and second optical areas OA1 and OA2, which is referred to as a first number, can be less than the number of subpixels connected to the second horizontal lines HL2 disposed only in the normal area NA without running through the first and second optical areas OA1 and OA2, which is referred to as a second number.

A difference between the first and second numbers can vary according to a difference between a resolution of each of the first and second optical areas OA1 and OA2 and a resolution of the normal area NA. For example, as a difference between a resolution of each of the first and second optical areas OA1 and OA2 and a resolution of the normal area NA increases, a difference between the first number and the second number can increase.

As described above, because the number (the first number) of subpixels connected to the first horizontal lines HL1 running through the first and second optical areas OA1 and OA2 is less than the number of subpixels (second number) connected to the second horizontal lines HL2 disposed only in the normal area NA without running through the first and second optical areas OA1 and OA2, an area where the first horizontal line HL1 overlaps other electrodes or lines adjacent to the first horizontal line HL1 can be smaller than an area where the second horizontal line HL2 overlaps other electrodes or lines adjacent to the second horizontal line HL2.

Accordingly, a parasitic capacitance formed between the first horizontal line HL1 and other electrodes or lines adjacent to the first horizontal line HL1, which is referred to as a first capacitance, can be much less than a parasitic capacitance formed between the second horizontal line HL2 and other electrodes or lines adjacent to the second horizontal line HL2, which is referred to as a second capacitance.

Considering a relationship in magnitude between the first and second resistances (the first resistance≥the second resistance) and a relationship in magnitude between the first and second capacitances (the first capacitance«second capacitance), a resistance-capacitance (RC) value of the first horizontal line HL1 running through the first and second optical areas OA1 and OA2, which is referred to as a first RC value, can be much less than an RC value of the second horizontal lines HL2 disposed only in the normal area NA without running through the first and second optical areas OA1 and OA2, which is referred to as a second RC value. Thus, in this example, the first RC value is much less than the second RC value (i.e., the first RC value«the second RC value).

Due to such a difference between the first RC value of the first horizontal line HL1 and the second RC value of the second horizontal line HL2, which is referred to as an RC load difference, a signal transmission characteristic through the first horizontal line HL1 can be different from a signal transmission characteristic through the second horizontal line HL2. Structures and locations of the signal lines disposed in the normal area NA and the first or second optical area (OA1 or OA2) will be described in detail below.

Figure 6:
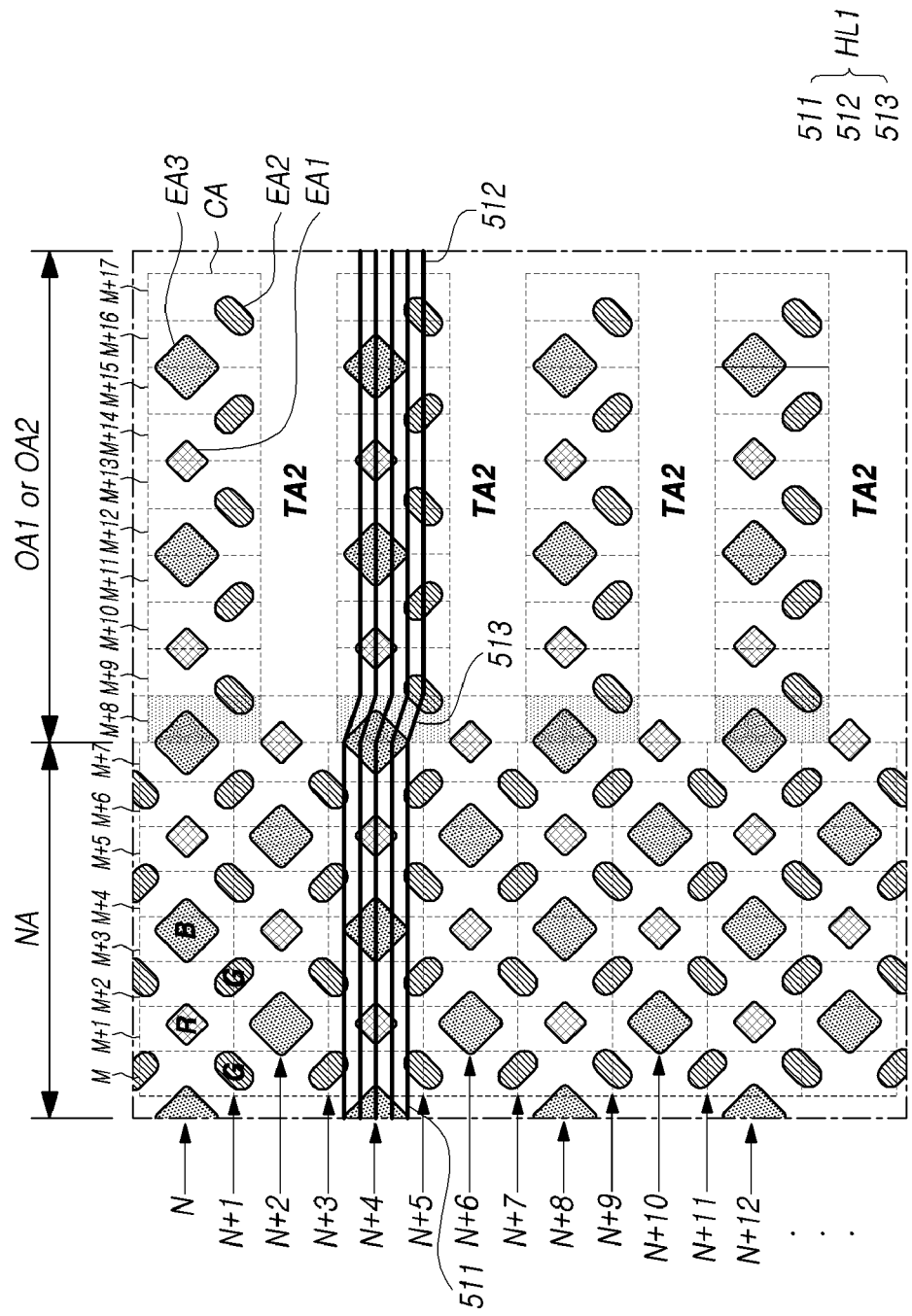
FIGS. 6 and 7 are overviews illustrating light emitting areas, circuit areas, transmission areas, and a plurality of first horizontal lines disposed in an optical area and a normal area in the display panel according to an aspect of the present disclosure.
Figure 7:
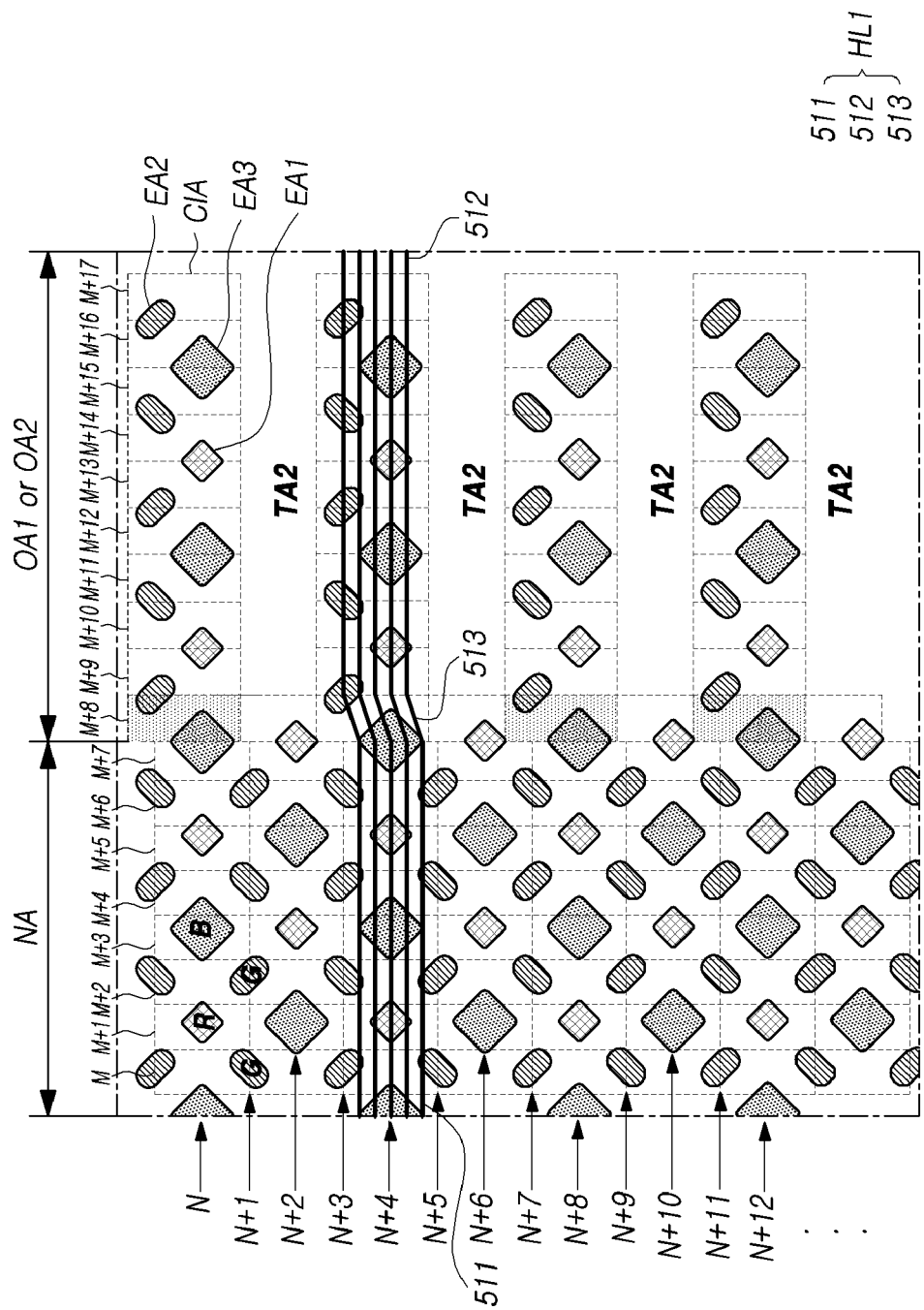

Next, FIGS. 6 and 7 are overviews illustrating light emitting areas, circuit areas, transmission areas, and first horizontal lines disposed in an optical area and a normal area in the display panel according to an aspect of the present disclosure. Referring to FIGS. 6 and 7, the display panel 110 includes the normal area NA, and a first optical area OA1 and/or a second optical area OA2.

The following description is based on an example where the optical area adjacent to the normal area NA shown in FIGS. 6 and 7 is the second optical area OA2. However, the description can be applied to when the optical area adjacent to the normal area NA is the first optical area OA1.

Referring to FIGS. 6 and 7, the normal area NA includes a plurality of light emitting areas EA1, EA2, and EA3, and one or more circuit areas CA. Also, the second optical area OA2 includes a plurality of second transmission areas TA2, a plurality of light emitting areas EA1, EA2, and EA3, and one or more circuit areas CA.

In addition, the circuit areas CA in the normal area NA and the second optical area OA2 can overlap the light emitting areas EA1, EA2, and EA3. A plurality of signal lines for driving the light emitting areas EA1, EA2, and EA3, a plurality of transistors, and a plurality of storage capacitors are also disposed in the circuit area CA. The light emitting areas EA1, EA2, and EA3 can include first light emitting areas EA1, second light emitting areas EA2, and third light emitting areas EA3. Each of the first to third light emitting areas EA1, EA2, and EA3 can emit light of a color different from one another.

For example, each first light emitting area EA1 can be for emitting red (R) light, each second light emitting area EA2 can be for emitting green (G) light, and each third light emitting area EA3 can be for emitting blue (B) light. However, embodiments of the present specification are not limited thereto. Further, each light emitting area EA1, EA2, and EA3 can be spaced apart from one another.

In addition, the emitting areas EA1, EA2, and EA3 can be disposed in a plurality of rows and a plurality of columns. For example, a plurality of first light emitting areas EA1 and a plurality of third light emitting areas EA3 can be alternately spaced apart from each other in row N (where N is an odd or even positive integer), row N+2, row N+4, row N+6, . . . , and the like.

Further, a plurality of second light emitting areas EA2 can be spaced apart from each other in row N+1, row N+3, row N+5, row N+7, . . . , and the like. Also, a plurality of second light emitting areas EA2 can be spaced apart from each other in column M (where M is an odd or even positive integer), column M+2, column M+4, . . . , and the like.

In addition, a plurality of first light emitting areas EA1 and a plurality of third light emitting areas EA3 can be alternately spaced apart from each other in column M+1, column M+3, column M+5, . . . , and the like. Also, respective shapes of the first to third light emitting areas EA1, EA2, and EA3 can be changed taking account of the lifespan and light emitting characteristics of organic light emitting elements (e.g., organic light emitting diodes OLED). Accordingly, the respective shapes of the first to third light emitting areas EA1, EA2, and EA3 can be different from one another.

In addition, the first to third light emitting areas EA1, EA2, and EA3 can have various shapes such as polygons, circles, or ellipses in a plan view. Also, the second optical area OA2 can be surrounded by the normal area NA and each second transmission area TA2 can be surrounded by a plurality of light emitting areas EA1, EA2, and EA3 and one or more circuit areas CA overlapping the light emitting areas EA1, EA2, and EA3.

For example, the second transmission areas TA2 can surrounded by circuit areas CA and light emitting areas EA1, EA2, and EA3 of the normal area NA, and circuit areas CA and light emitting areas EA1, EA2, and EA3 of the second optical area OA2. Arrangements of the light emitting areas EA1, EA2, and EA3 disposed in the second optical area OA2 can correspond to arrangements of the light emitting areas EA1, EA2, and EA3 disposed in the normal area NA.

For example, as illustrated in FIGS. 6 and 7, the light emitting areas EA1, EA2, and EA3 disposed in the second optical area OA2 can be disposed in a plurality of rows and a plurality of columns. For example, a plurality of first light emitting areas EA1 and a plurality of third light emitting areas EA3 can be alternately spaced apart from each other in row N (where N is an odd or even positive integer), row N+4, row N+8, row N+12, . . . , and the like. Further, a plurality of second light emitting areas EA2 can be spaced apart from each other in row N+1, row N+5, row N+9, . . . , and the like.

As described above, in the normal area NA, the first light emitting areas EA1 and the third light emitting areas EA3 can be spaced apart from each other in row N (where N is an odd or even positive integer), row N+2, row N+4, row N+6, . . . , and the like, and as such, the light emitting areas (EA1 and EA3) of different colors can be alternately disposed. In contrast, in the second optical area OA2, a plurality of first light emitting area EA1 and a plurality of third light emitting areas EA3 are not disposed in one or more of the rows in which in the normal area NA, the first light emitting areas EA1 and the third light emitting areas EA3 are disposed.

For example, as illustrated in FIGS. 6 and 7, in the second optical area OA2, a plurality of first light emitting area EA1 and a plurality of third light emitting areas EA3 are not disposed in row N+2, row N+6, row N+10, . . . , and the like. Areas corresponding to row N+2, row N+6, row N+10, . . . , etc. in the second optical area OA2 can be second transmission areas TA. These second transmission areas TA2 can be located to correspond to a plurality of columns. For example, one second transmission area TA2 can be disposed in rows N+2 and N+3, and columns M+9 to M+17.

The above description is based on the rows and columns in which the light emitting areas EA1, EA2, and EA3 are disposed in the normal area NA and the second optical area OA2, and the locations in which the second transmission areas TA2 in the second optical area OA2 are disposed. However, respective locations or arrangements of the light emitting areas EA1, EA2, and EA3 and the second transmission areas TA2 can be changed according to design requirements.

Referring to FIGS. 6 and 7, the light emitting areas EA1, EA2, and EA3 can be controlled to emit light by corresponding light emitting elements receiving signals provided through signal lines disposed in circuit areas CA and overlapping the light emitting areas EA1, EA2, and EA3.

A plurality of first horizontal lines HL1 are also included in the signal lines. In an embodiment, one or more of the first horizontal lines HL1 can be disposed in one row. For example, referring to FIGS. 6 and 7, one or more of the first horizontal lines HL1 can be used for driving the first light emitting areas EA1 and the third light emitting areas EA3 disposed in row N.

The first light emitting areas EA1 and the third light emitting areas EA3 disposed in row N in the normal area NA can also share one or more of the first horizontal lines HL1 with the first light emitting areas EA1 and the third light emitting areas EA3 disposed in row N in the second optical area OA2. For example, among the light emitting areas EA1, EA2, and EA3 disposed in the normal area NA and the second optical area OA2, light emitting areas disposed in the same row can receive signals through one or more same first horizontal lines HL1. In addition, the first horizontal lines HL1 can include any one of either a metal such as aluminum (Al), gold (Au), silver (Ag), copper (Cu), tungsten (W), molybdenum (Mo), chromium (Cr), tantalum (Ta), titanium (Ti), and the like, or an alloy of two or more of these metals; however, embodiments of the present disclosure are not limited thereto.

Also, the first horizontal lines HL1 can include at least one portion bent in at least one boundary area between the normal area NA and the second optical area OA2. For example, as illustrated in FIGS. 6 and 7, one or more of the first horizontal lines HL1 can include at least one bent portion formed in a portion of the second optical area OA2 adjacent to the normal area NA. Also, one or more of the first horizontal lines HL1 can include a first portion 511, a second portion 512, and a connection portion 513.

As illustrated in FIGS. 6 and 7, the first portion 511 of the first horizontal line HL1 is disposed in the normal area NA, and the second portion 512 of the first horizontal line HL1 is disposed in the second optical area OA2. The connection portion 513 of the first horizontal line HL1 is also disposed in the second optical area OA2, for example, disposed between the first portion 511 and the second portion 512.

Also, the first portion 511 of the first horizontal line HL1 extends up to a portion of the second optical area OA2. The first portion 511 and the second portion 512 of the first horizontal line HL1 also extend in the same direction (e.g., the horizontal direction). For example, the first portion 511 and the second portion 512 can be disposed in parallel.

In an embodiment, the connection portion 513 can extend in a direction different from the direction where the first portion 511 and the second portion 512 extend. As illustrated in FIGS. 6 and 7, the connection portion 513 can extend in an inclined direction. Also, at least one first horizontal line HL1 can include the first portion 511, the second portion 512, and the connection portion 513 between the first and second portions 511 and 512, through which a same signal is supplied.

As shown, although the first portion 511 and the second portion 512 extend in the same direction, a location of the second portion 512 can be shifted relative to the first portion 511 due to the shape of the connection portion 513. For example, as illustrated in FIG. 6, when the connection portion 513 of the first horizontal line HL1 extends in a direction inclined in a range of angles greater than or equal to −90° and less than 0° relative to the horizontal direction, the second portion 512 thereof can be placed in a lower location than the first portion 511 thereof in a plan view.

In another example, as illustrated in FIG. 7, when the connection portion 513 of the first horizontal line HL1 extends in a direction inclined in a range of angles greater than 0° and less than or equal to 90° relative to the horizontal direction, the second portion 512 thereof can be placed in a higher location than the first portion 511 thereof in the plan view.

Although FIGS. 6 and 7 illustrate the first portion 511 and the second portion 512 extending to the second optical area OA2, embodiments of the present disclosure are not limited thereto. For example, a plurality of first horizontal lines HL1 can be disposed only in the normal area NA.

Referring to FIGS. 6 and 7, a plurality of first horizontal lines HL1 overlap the light emitting areas EA1, EA2, and EA3 disposed in the normal area NA and the second optical area OA2. For example, referring to FIG. 6, in the normal area NA, first horizontal lines HL1 overlap second light emitting areas EA2 disposed in rows N+3 and N+5, and overlap a plurality of first and third light emitting areas EA1 and EA3 disposed in row N+4. Further, in the second optical area OA2, first horizontal lines HL1 overlap second light emitting areas EA2 disposed in row N+5, and overlap first and third light emitting areas EA1 and EA3 disposed in row N+4.

As illustrated in FIG. 6, in the normal area NA, the second light emitting areas EA2 can be disposed in row N+3; in contrast, in the second optical area OA2, an area corresponding to row N+3 of the normal area NA can be a second transmission area TA2. In other words, in the second optical area OA2, a plurality of second light emitting areas EA2 are disposed in row N+3. The second light emitting areas EA2 disposed in row N+3 can also be disposed only in the normal area NA.

When a first horizontal line HL1 overlapping the second light emitting areas EA2 disposed in row N+3 in the normal area NA extends to the second optical area OA2, the transmittance of the second transmission area TA2 can be reduced, because the first horizontal line HL1 is also disposed in a portion of a second transmission area TA2. Accordingly, as illustrated in FIG. 6, the first horizontal line HL1 overlapping the second light emitting areas EA2 disposed in row N+3 in the normal area NA can overlap first and third light emitting areas EA1 and EA2 disposed in row N+4 of the second optical area OA2 through a corresponding connection portion 513 disposed in the second optical area OA2 and extending in an inclined direction.

As shown, a plurality of first horizontal lines HL1 overlapping first and third light emitting areas EA1 and EA3 disposed in row N+4 in the normal area NA can overlap first and third light emitting areas EA1 and EA3 disposed in row N+4 of the optical area OA2. Further, one or more of the first horizontal lines HL1 can overlap upper edges of a plurality of second light emitting areas EA2 disposed in row N+5 of the normal area NA.

Also, the one or more first horizontal lines HL1 overlapping the upper edges of the second light emitting areas EA2 disposed in row N+5 of the normal area NA can be disposed closer to center portions of the second light emitting areas EA2 disposed in row N+5 of the second optical area OA2 by a corresponding connection portion 513 extending in an inclined direction (that is, overlapping the center portions of the second light emitting areas EA2, compared with overlapping the upper edges of the second light emitting areas EA2 in the normal area NA).

The above description of FIG. 6 has been provided based on the second optical area OA2 and one or more second transmission areas TA2 are disposed in a higher row in a plan view than one row including first and third light emitting areas EA1 and EA3, and the second light emitting areas EA2 are disposed in a lower row in the plan view than the one row; however, embodiments of the present disclosure are not limited thereto.

For example, as illustrated in FIG. 7, in the second optical area OA2, a plurality of second light emission areas EA2 can be disposed in a higher row in the plan view than one row in which the first and third light emission areas EA1 and EA3 are disposed, and one or more second transmission area TA2 can be disposed in a lower row in the plan view than the one row. In this example, as illustrated in FIG. 7, a first horizontal line HL1 overlapping a plurality of second light emitting areas EA2 disposed in row N+3 in the normal area NA can extend to the second optical area OA2 through a corresponding connection portion 513 disposed in the second optical area OA2, and be located closer to center portions of a plurality of second light emitting areas EA2 disposed in row N+3 of the second optical area OA2.

Thus, the first horizontal lines HL1 can be prevented from reducing the transmittance of the second optical area OA2, because the first horizontal lines HL1 in the second optical area OA2 are shifted or bent to lower or higher locations (or prior or following rows/columns) compared with locations of the first horizontal lines HL1 in the normal area NA.

Figure 8:
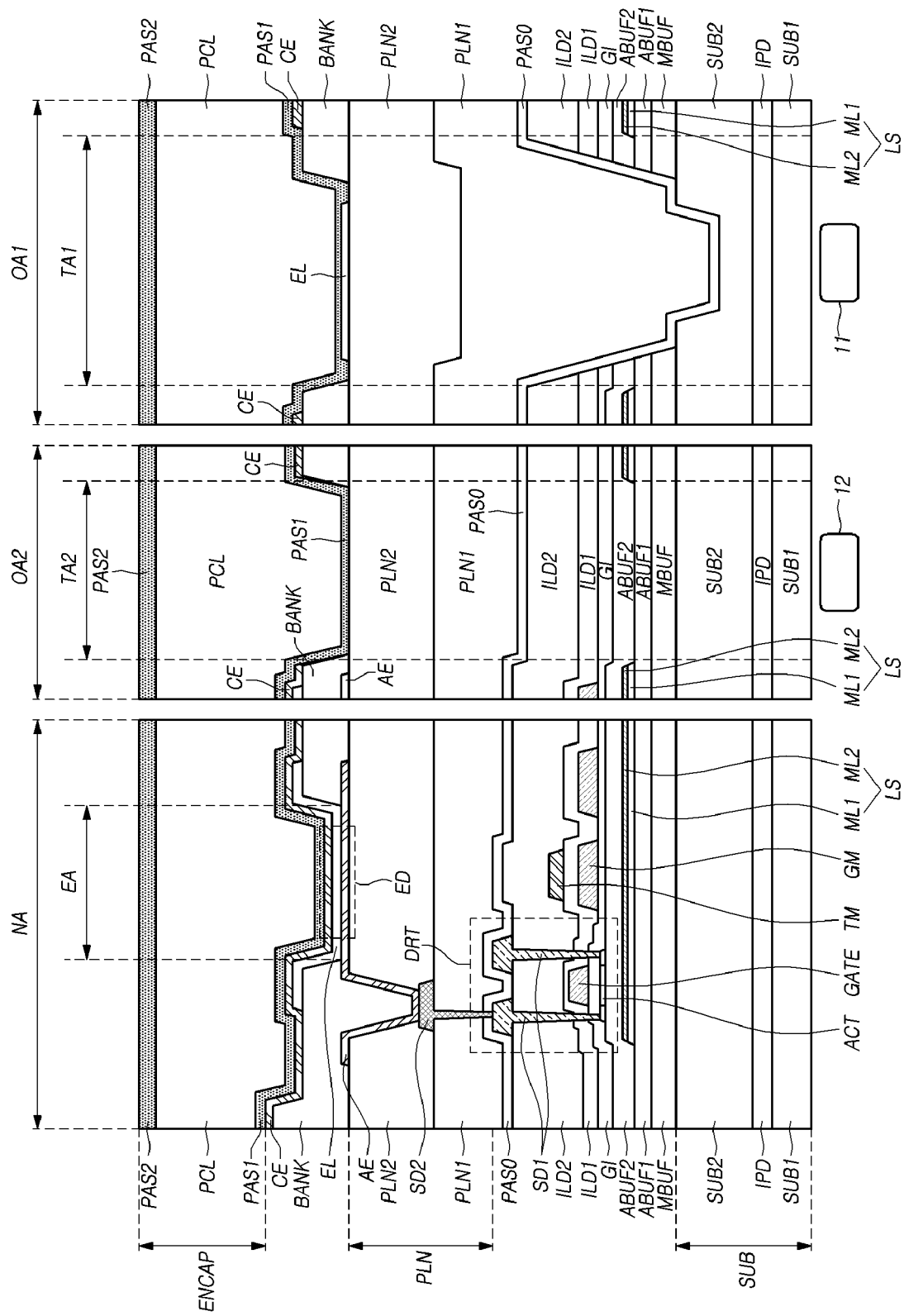
FIGS. 8 and 9 are cross-sectional views of each of the first optical area, the second optical area, and the normal area included in a display area of the display panel according to an aspect of the present disclosure.
Figure 9:
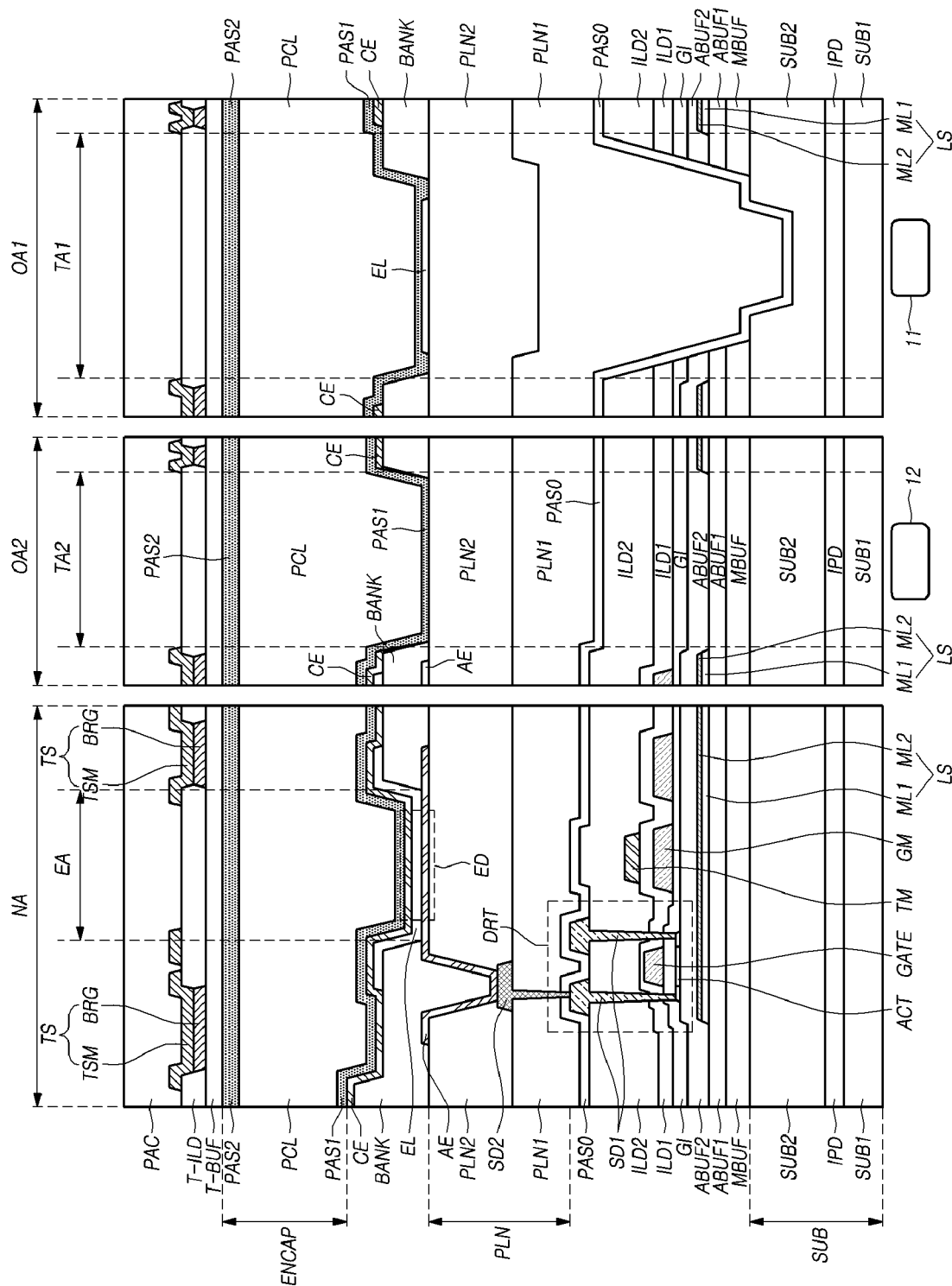

Next, FIGS. 8 and 9 are cross-sectional views of the first optical area, the second optical area, and the normal area according to an aspect of the present disclosure. In particular, FIG. 8 includes cross-sectional views of the display panel 110 when a touch sensor is provided outside of the display panel 110, and FIG. 9 includes cross-sectional views of the display panel 110 when a touch sensor TS is provided inside of the display panel 110.

FIGS. 8 and 9 also include cross-sectional views of the normal area NA, the first optical area OA1, and the second optical area OA2 included in the display area DA. First, a stack structure of the normal area NA will be described with reference to FIGS. 8 and 9. Respective light emitting areas EA of the first and second optical areas OA1 and OA2 can have the same stack structure as a light emitting area EA of the normal area NA.

Referring to FIGS. 8 and 9, a substrate SUB includes a first substrate SUB1, an interlayer insulating layer IPD, and a second substrate SUB2. The interlayer insulating layer IPD is interposed between the first substrate SUB1 and the second substrate SUB2. As the substrate SUB includes the first substrate SUB1, the interlayer insulating layer IPD, and the second substrate SUB2, the substrate SUB can prevent or reduce the penetration of moisture. Further, the first and second substrates SUB1 and SUB2 can be, for example, polyimide (PI) substrates. The first and second substrate SUB1 and SUB 2 can be referred to as a primary PI substrate and a secondary PI substrate, respectively.

Referring to FIGS. 8 and 9, various types of patterns (ACT, SD1, GATE), for disposing transistors such as a driving transistor DRT, and the like, various types of insulating layers (MBUF, ABUF1, ABUF2, GI, ILD1, ILD2, PAS0), and various types of metal patterns (TM, GM, ML1, ML2) can be disposed on or over the substrate SUB. In addition, as shown, a multi-buffer layer MBUF is disposed on the second substrate SUB2, and a first active buffer layer ABUF1 is disposed on the multi-buffer layer MBUF.

In addition, a first metal layer ML1 and a second metal layer ML2 can be disposed on the first active buffer layer ABUF1. Also, the first and second metal layers ML1 and ML2 can be, for example, light shielding layers LS. A second active buffer layer ABUF2 can also be disposed on the first and second metal layers ML1 and ML2. An active layer ACT of the driving transistor DRT is also disposed on the second active buffer layer ABUF2.

A gate insulating layer GI is disposed to cover the active layer ACT, and a gate electrode GATE of the driving transistor DRT is disposed on the gate insulating layer GI. Further, a gate material layer GM is disposed on the gate insulating layer GI, together with the gate electrode GATE of the driving transistor DRT, at a location different from the location where the driving transistor DRT is disposed.

As shown, a first interlayer insulating layer ILD1 is disposed to cover the gate electrode GATE and the gate material layer GM. A metal pattern TM is also disposed on the first interlayer insulating layer ILD1 at a location different from the location where the driving transistor DRT is formed. A second interlayer insulating layer ILD2 is further disposed to cover the metal pattern TM on the first interlayer insulating layer ILD1.

Further, two first source-drain electrode patterns SD1 are disposed on the second interlayer insulating layer ILD2. One of the two first source-drain electrode patterns SD1 can be a source node of the driving transistor DRT, and the other can be a drain node of the driving transistor DRT. The two first source-drain electrode patterns SD1 can be electrically connected to first and second side portions of the active layer ACT, respectively, through contact holes formed in the second interlayer insulating layer ILD2, the first interlayer insulating layer ILD1, and the gate insulating layer GI.

A portion of the active layer ACT overlapping the gate electrode GATE can serve as a channel region. Also, one of the two first source-drain electrode patterns SD1 can be connected to the first side portion of the channel region of the active layer ACT, and the other of the two first source-drain electrode patterns SD1 can be connected to the second side portion of the channel region of the active layer ACT.

A passivation layer PAS0 is also disposed to cover the two first source-drain electrode patterns SD1, and a planarization layer PLN is disposed on the passivation layer PAS0. As shown, the planarization layer PLN can include a first planarization layer PLN1 and a second planarization layer PLN2. In particular, the first planarization layer PLN1 can be disposed on the passivation layer PAS0.

A second source-drain electrode pattern SD2 is also disposed on the first planarization layer PLN1 and is connected to one of the two first source-drain electrode patterns SD1 (corresponding to the second node N2 of the driving transistor DRT in the subpixel SP of FIG. 3) through a contact hole formed in the first planarization layer PLN1.

The second planarization layer PLN2 can also be disposed to cover the second source-drain electrode pattern SD2. Further, a light emitting element ED is disposed on the second planarization layer PLN2. According to an example stack structure of the light emitting element ED, an anode electrode AE can be disposed on the second planarization layer PLN2 and electrically connected to the second source-drain electrode pattern SD2 through a contact hole formed in the second planarization layer PLN2.

A bank BANK is also disposed to cover a portion of the anode electrode AE, and as shown, a portion of the bank BANK corresponding to a light emitting area EA of the subpixel SP is opened. A portion of the anode electrode AE can then be exposed through an opening (the opened portion) of the bank BANK. An emission layer EL can also be disposed on side surfaces of the bank BANK and in the opening (the opened portion) of the bank BANK. All or at least a portion of the emission layer EL can be located between adjacent banks.

In the opening of the bank BANK, the emission layer EL contacts the anode electrode AE, and a cathode electrode CE is also disposed on the emission layer EL. The light emitting element ED can thus be formed by including the anode electrode AE, the emission layer EL, and the cathode electrode CE, as described above. The emission layer EL can also include an organic material layer.

Further, an encapsulation layer ENCAP is disposed on the stack of the light emitting element ED and can have a single-layer structure or a multi-layer structure. For example, as shown in FIGS. 8 and 9, the encapsulation layer ENCAP can include a first encapsulation layer PAS1, a second encapsulation layer PCL, and a third encapsulation layer PAS2.

In particular, the first encapsulation layer PAS1 and the third encapsulation layer PAS2 can be, for example, an inorganic material layer, and the second encapsulation layer PCL can be, for example, an organic material layer. Among the first encapsulation layer PAS1, the second encapsulation layer PCL, and the third encapsulation layer PAS2, the second encapsulation layer PCL can be the thickest and serve as a planarization layer.

In addition, the first encapsulation layer PAS1 can also be disposed on the cathode electrode CE closest to the light emitting element ED. The first encapsulation layer PAS1 can include an inorganic insulating material capable of being deposited using low-temperature deposition. For example, the first encapsulation layer PAS1 can include, but not limited to, silicon nitride (SiNx), silicon oxide (SiOx), silicon oxynitride (SiON), aluminum oxide (Al2O3), or the like. Because the first encapsulation layer PAS1 can be deposited in a low temperature atmosphere, during the deposition process, the first encapsulation layer PAS1 can prevent the emission layer EL including an organic material vulnerable to a high temperature atmosphere from being damaged.

In addition, the second encapsulation layer PCL can have a smaller area or size than the first encapsulation layer PAS1. For example, the second encapsulation layer PCL can be disposed to expose both ends or edges of the first encapsulation layer PAS1. The second encapsulation layer PCL can also serve as a buffer for relieving stress between corresponding layers while the display device 100 is curved or bent, and to enhance planarization performance. For example, the second encapsulation layer PCL can include an organic insulating material, such as acrylic resin, epoxy resin, polyimide, polyethylene, silicon oxycarbon (SiOC), or the like. The second encapsulation layer PCL can be disposed, for example, using an inkjet scheme.

Further, the third encapsulation layer PAS2 can be disposed over the substrate SUB over which the second encapsulation layer PCL is disposed such that the third encapsulation layer PAS2 covers the respective top surfaces and side surfaces of the second encapsulation layer PCL and the first encapsulation layer PAS1. The third encapsulation layer PAS2 can thus minimize, reduce, or prevent external moisture or oxygen from penetrating into the first encapsulation layer PAS1 and the second encapsulation layer PCL. For example, the third encapsulation layer PAS2 can include an inorganic insulating material, such as silicon nitride (SiNx), silicon oxide (SiOx), silicon oxynitride (SiON), aluminum oxide (Al2O3), or the like.

Referring to FIG. 9, when the touch sensor TS is embedded into the display panel 110, the touch sensor TS can be disposed on the encapsulation layer ENCAP. The structure of the touch sensor will be described in more detail as follows. A touch buffer layer T-BUF can be disposed on the encapsulation layer ENCAP, and the touch sensor TS can be disposed on the touch buffer layer T-BUF.

Further, the touch sensor TS can include touch sensor metals TSM and at least one bridge metal BRG, which are located in different layers. A touch interlayer insulating layer T-ILD can also be disposed between the touch sensor metals TSM and the bridge metal BRG. For example, the touch sensor metals TSM can include a first touch sensor metal TSM, a second touch sensor metal TSM, and a third touch sensor metal TSM, which are disposed adjacent to one another. When the third touch sensor metal TSM is disposed between the first touch sensor metal TSM and the second touch sensor metal TSM, and the first touch sensor metal TSM and the second touch sensor metal TSM need to be electrically connected to each other, the first touch sensor metal TSM and the second touch sensor metal TSM can be electrically connected to each other through the bridge metal BRG located in a different layer. The bridge metal BRG can also be electrically insulated from the third touch sensor metal TSM by the touch interlayer insulating layer T-ILD.

While the touch sensor TS is disposed on the display panel 110, a chemical solution (e.g., a developer or etchant) used in the corresponding process or moisture from the outside can be generated or introduced. In addition, by disposing the touch sensor TS on the touch buffer layer T-BUF, a chemical solution or moisture can be prevented from penetrating into the emission layer EL including an organic material during the manufacturing process of the touch sensor TS. Accordingly, the touch buffer layer T-BUF can prevent damage to the emission layer EL, which is vulnerable to a chemical solution or moisture.

To prevent damage to the emission layer EL including an organic material, which is vulnerable to high temperatures, the touch buffer layer T-BUF can be formed at a low temperature less than or equal to a predetermined temperature (e.g., 100° C.) and be formed using an organic insulating material having a low permittivity of 1 to 3. For example, the touch buffer layer T-BUF can include an acrylic-based, epoxy-based, or siloxan-based material. As the display device 100 is bent, the encapsulation layer ENCAP can be damaged, and the touch sensor metal located on the touch buffer layer T-BUF can be cracked or broken. Even when the display device 100 is bent, the touch buffer layer T-BUF having the planarization performance as the organic insulating material can prevent the damage of the encapsulation layer ENCAP and/or the cracking or breaking of the metals (TSM, BRG) included in the touch sensor TS. A protective layer PAC can also be disposed to cover the touch sensor TS. The protective layer PAC can be, for example, an organic insulating layer.

Next, a stack structure of the first optical area OA1 will be described with reference to FIGS. 8 and 9. As shown, the light emitting area EA of the first optical area OA1 can have the same stack structure as that in the normal area NA. Accordingly, a stack structure of the first transmission area TA1 of the first optical area OA1 will be described in detail below.

In addition, the cathode electrode CE can be disposed in the light emitting areas EA included in the normal area NA and the first optical area OA1, and not be disposed in the first transmission area TA1 in the first optical area OA1. For example, the first transmission area TA1 can correspond to an opening of the cathode electrode CE.

Further, a light shield layer LS including at least one of the first metal layer ML1 and the second metal layer ML2 can be disposed in the light emitting areas EA included in the normal area NA and the first optical area OA1, and not be disposed in the first transmission area TA1. For example, the first transmission area TA1 of the first optical area OA1 can correspond to an opening of the light shield layer LS.

In addition, the substrate SUB and the various types of insulating layers (MBUF, ABUF1, ABUF2, GI, ILD1, ILD2, PAS0, PLN (PLN1, PLN2), BANK, ENCAP (PAS1, PCL, PAS2), T-BUF, T-ILD, PAC) disposed in the light emitting areas EA included in the normal area NA and the first optical area OA1 can be disposed in the first transmission area TA1 in the first optical area OA1 equally, substantially equally, or similarly.

However, one or more material layers having electrical properties (e.g., one or more metal material layers, and/or one or more semiconductor layers), except for the insulating materials or layers, disposed in the light emitting areas EA included in the normal area NA and the first optical area OA1 may not be disposed in the first transmission area TA1 in the first optical area OA1. For example, referring to FIGS. 8 and 9, one or more of the metal material layers (ML1, ML2, GATE, GM, TM, SD1, SD2) related to at least one transistor and the semiconductor layer ACT are not disposed in the first transmission area TA1.

As shown, the anode electrode AE and the cathode electrode CE included in the light emitting element ED are not disposed in the first transmission area TA1. In addition, the emission layer EL of the light emitting element ED may or may not be disposed in the first transmission area TA1 according to a design requirement.

In addition, referring to FIG. 9, the touch sensor metal TSM and the bridge metal BRG included in the touch sensor TS are not disposed in the first transmission area TA1 of the first optical area OA1. Accordingly, the light transmittance of the first transmission area TA1 in the first optical area OA1 can be improved because the material layers (e.g., one or more metal material layers, and/or one or more semiconductor layers) having electrical properties are not disposed in the first transmission area TA1. Thus, the first optical electronic device 11 can perform a predefined function (e.g., image sensing) by receiving light transmitting through the first transmission area TA1.

In addition, because one or more of the first transmission area TA1 overlap the first optical electronic device 11, it is preferably to further increase a transmittance of the first transmission area TA1 in the first optical area OA1. To achieve the foregoing, a transmittance improvement structure TIS is provided to the first transmission area TA1 of the first optical area OA1. Referring to FIGS. 8 and 9, the insulating layers included in the display panel 110 can include at least one buffer layer (MBUF, ABUF1 and/or ABUF2) between at least one substrate (SUB1 and/or SUB2) and at least one transistor (DRT and/or SCT), at least one planarization layers (PLN1 and/or PLN2) between the transistor DRT and the light emitting element ED, at least one encapsulation layer ENCAP on the light emitting element ED, and the like.

Referring to FIG. 9, the insulating layers included in the display panel 110 can further include the touch buffer layer T-BUF and the touch interlayer insulating layer T-ILD located on the encapsulation layer ENCAP, and the like. Referring to FIGS. 8 and 9, the first transmission area TA1 of the first optical area OA1 can have a structure in which the first planarization layer PLN1 and the passivation layer PAS0 have depressed portions that extend downward from respective surfaces thereof as a transmittance improvement structure TIS.

Among the insulating layers, the first planarization layer PLN1 can include at least one depression (e.g., a recess, a trench, a concave portion, a protrusion, etc.). The first planarization layer PLN1 can be, for example, an organic insulating layer. When the first planarization layer PLN1 has the depressed portion that extends downward from the surfaces thereof, the second planarization layer PLN2 can provide planarization. In another embodiment, the second planarization layer PLN2 can also have a depressed portion that extends downward from the surface thereof. In this other embodiment, the second encapsulation layer PCL can provide planarization.

Referring to FIGS. 8 and 9, the depressed portions of the first planarization layer PLN1 and the passivation layer PAS0 pass through insulating layers, such as the first interlayer insulating layer ILD1, the second interlayer insulating layer ILD2, the gate insulating layer GI, etc., for forming the transistor DRT, and buffer layers, such as the first active buffer layer ABUF1, the second active buffer layer ABUF2, the multi-buffer layer MBUF, and the like, located under the insulating layers, and extend up to an upper portion of the second substrate SUB2.

In addition, the substrate SUB can include at least one concave portion or depressed portion as a transmittance improvement structure TIS. For example, in the first transmission area TA1, an upper portion of the second substrate SUB2 can be indented or depressed downward, or the second substrate SUB2 can be perforated.

Further, the first and second encapsulation layers PAS1 and PCL included in the encapsulation layer ENCAP can also have a transmittance improvement structure TIS in which the first and second encapsulation layers PAS1 and PCL have depressed portions that extend downward from the respective surfaces thereof. The second encapsulation layer PCL can be, for example, an organic insulating layer.

Referring to FIG. 9, the protective layer PAC can be disposed to cover the touch sensor TS on the encapsulation layer ENCAP to protect the touch sensor TS. In addition, the protective layer PAC can have at least one depression (e.g., a recess, a trench, a concave portion, a protrusion, or the like) as a transmittance improvement structure TIS in a portion overlapping the first transmission area TA1. The protective layer PAC can be, for example, an organic insulating layer.

As shown in FIG. 9, the touch sensor TS can include touch sensor metals TSM in a mesh type including a plurality of openings. Each opening can be located to correspond to the light emitting area EA of the subpixel SP.

For the first optical area OA1 to have a transmittance greater than the normal area NA, an area or size of the touch sensor metal TSM per unit area in the first optical area OA1 can be smaller than an area or size of the touch sensor metal TSM per unit area in the normal area NA. Referring to FIG. 9, the touch sensor TS is disposed in the light emitting area EA of the first optical area OA1, and is not disposed in the first transmission area TA1 of the first optical area OA1.

Next, a stack structure of the second optical area OA2 will be described with reference to FIGS. 8 and 9. The light emitting areas EA of the second optical area OA2 can have the same stack structure as that of the normal area NA. Accordingly, a stack structure of the second transmission area TA2 in the second optical area OA2 will be described in detail below.

In addition, the cathode electrode CE can be disposed in the light emitting areas EA included in the normal area NA and the second optical area OA2, and not disposed in the second transmission area TA2 in the second optical area OA2. For example, the second transmission area TA2 can correspond to an opening of the cathode electrode CE.

Further, the light shield layer LS including at least one of the first and second metal layers ML1 and ML2 can be disposed in the light emitting areas EA included in the normal area NA and the second optical area OA2, and not disposed in the second transmission area TA2 in the second optical area OA2. For example, the second transmission area TA2 can correspond to an opening of the light shield layer LS.

When the transmittance of the second optical area OA2 and the transmittance of the first optical area OA1 are the same, the stack structure of the second transmission area TA2 in the second optical area OA2 can be the same as the stacked structure of the first transmission area TA1 in the first optical area OA1. When the transmittance of the second optical area OA2 and the transmittance of the first optical area OA1 are different, the stack structure of the second transmission area TA2 in the second optical area OA2 can be different at least in part from as the stacked structure of the first transmission area TA1 in the first optical area OA1.

For example, as shown in FIGS. 8 and 9, when the transmittance of the second optical area OA2 is lower than the transmittance of the first optical area OA1, the second transmission area TA2 in the second optical area OA2 may not include a transmittance improvement structure TIS. Thus, the first planarization layer PLN1 and the passivation layer PAS0 may not be indented or depressed. In addition, a width of the second transmission area TA2 in the second optical area OA2 can be smaller than a width of the first transmission area TA1 in the first optical area OA1.

Further, the substrate SUB and the various types of insulating layers (MBUF, ABUF1, ABUF2, GI, ILD1, ILD2, PAS0, PLN (PLN1, PLN2), BANK, ENCAP (PAS1, PCL, PAS2), T-BUF, T-ILD, PAC) disposed in the light emitting areas EA included in the normal area NA and the second optical area OA2 can be disposed in the second transmission area TA2 of the second optical area OA2 equally, substantially equally, or similarly.

However, one or more material layers having electrical properties (e.g., one or more metal material layers, and/or optical area semiconductor layers), except for the insulating materials or layers, disposed in the light emitting areas EA included in the normal area NA and the second optical area OA2 may not be disposed in the second transmission area TA2. For example, referring to FIGS. 8 and 9, one or more of the metal material layers (ML1, ML2, GATE, GM, TM, SD1, SD2) related to at least one transistor and the semiconductor layer ACT are not disposed in the second transmission area TA2 of the second optical area OA2.

In addition, the anode electrode AE and the cathode electrode CE included in the light emitting element ED are not disposed in the second transmission area TA2 of the second optical area OA2. Further, the emission layer EL of the light emitting element ED may or may not be disposed in the second transmission area TA2 of the second optical area OA2.

In addition, referring to FIG. 9, the touch sensor metal TSM and the bridge metal BRG included in the touch sensor TS are not disposed in the second transmission area TA2 of the second optical area OA2. Accordingly, the light transmittance of the second transmission area TA2 in the second optical area OA2 can be improved because the material layers (e.g., one or more metal material layers, and/or one or more semiconductor layers) having electrical properties are not disposed in the second transmission area TA2 in the second optical area OA2. Thus, the second optical electronic device 12 can perform a predefined function (e.g., detecting an object or human body, or an external illumination detection) by receiving light transmitting through the second transmission area TA2.

Figure 10:
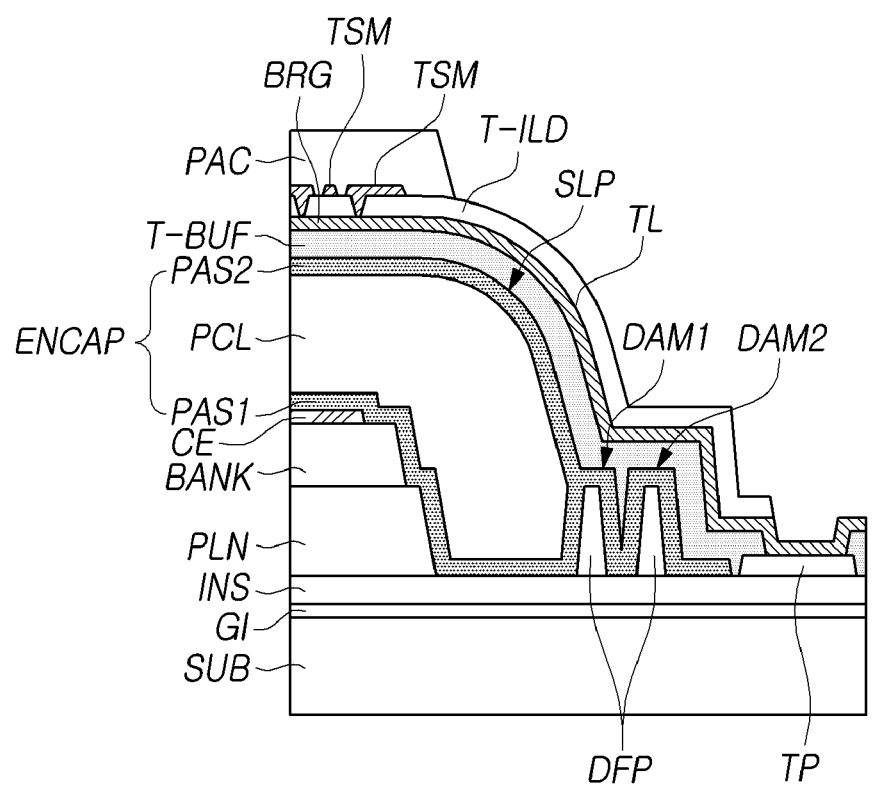
FIG. 10 is a cross-sectional view of an edge of the display panel according to an aspect of the present disclosure.

Next, FIG. 10 is a cross-sectional view of an edge of the display panel 110 according to an aspect of the present disclosure. A single substrate SUB including the first substrate SUB1 and the second substrate SUB2 is illustrated, and layers or portions located under the bank BANK are illustrated in a simplified manner. As shown, FIG. 10 illustrates a single planarization layer PLN including the first planarization layer PLN1 and the second planarization layer PLN2, and a single interlayer insulating layer INS including the second interlayer insulating layer ILD2 and the first interlayer insulating layer ILD1 located under the planarization layer PLN.

Referring to FIG. 10, the first encapsulation layer PAS1 is disposed on the cathode electrode CE and closest to the light emitting element ED. Further, the second encapsulation layer PCL can have a smaller area or size than the first encapsulation layer PAS1. For example, the second encapsulation layer PCL can be disposed to expose both ends or edges of the first encapsulation layer PAS1.

The third encapsulation layer PAS2 can be disposed over the substrate SUB over which the second encapsulation layer PCL is disposed such that the third encapsulation layer PAS2 covers the respective top surfaces and side surfaces of the second encapsulation layer PCL and the first encapsulation layer PAS1. The third encapsulation layer PAS2 can thus minimize, reduce, or prevent external moisture or oxygen from penetrating into the first encapsulation layer PAS1 and the second encapsulation layer PCL.

Referring to FIG. 10, to prevent the encapsulation layer ENCAP from collapsing, the display panel 110 can include one or more dams (DAM1 and/or DAM2) at, or near to, an end or edge of an inclined surface SLP of the encapsulation layer ENCAP. The one or more dams (DAM1 and/or DAM2) can be provided at, or near to, a boundary point between the display area DA and the non-display area NDA. The one or more dams (DAM1 and/or DAM2) can include the same material DFP as the bank BANK.

Referring to FIG. 10, the second encapsulation layer PCL including an organic material can be located only on an inner side of a first dam DAM1, which is located closest to the inclined surface SLP of the encapsulation layer ENCAP among the dams. For example, the second encapsulation layer PCL may not be located on all of the dams (DAM1 and DAM2). In another embodiment, the second encapsulation layer PCL including an organic material can be located on at least the first dam DAM1 and a second dam DAM2. For example, the second encapsulation layer PCL can extend only up to all, or at least a portion, of an upper portion of the first dam DAM1. In addition, the second encapsulation layer PCL can extend past the upper portion of the first dam DAM1 and extend up to all, or at least a portion of, an upper portion of the secondary dam DAM2.

As shown in FIG. 10, a touch pad TP, to which the touch driving circuit 260 shown in FIG. 2 is electrically connected, can be disposed on a portion of the substrate SUB outside of the one or more dams (DAM1, DAM2). A touch line TL can electrically connect, to the touch pad TP, the touch sensor metal TSM or the bridge metal BRG included in, or serving as, a touch electrode disposed in the display area DA.

Further, one end or edge of the touch line TL can be electrically connected to the touch sensor metal TSM or the bridge metal BRG, and the other end or edge of the touch line TL can be electrically connected to the touch pad TP. The touch line TL can also run downward along the inclined surface SLP of the encapsulation layer ENCAP, run along the respective upper portions of the one or more dams (DAM1 and/or DAM2), and extend up to the touch pad TP disposed outside of the one or more dams (DAM1 and/or DAM2). In addition, the touch line TL can be the bridge metal BRG. In another embodiment, the touch line TL can be the touch sensor metal TSM.

Next, FIGS. 11 to 15 schematically illustrate that when at least one first horizontal line includes a connection portion in at least a portion of an optical area, one or more light emitting areas included in the optical area are connected to one or more circuit areas of one or more other light emitting areas and be driven to perform a predefined function in the display panel according to an aspect of the present disclosure.

Figure 11:
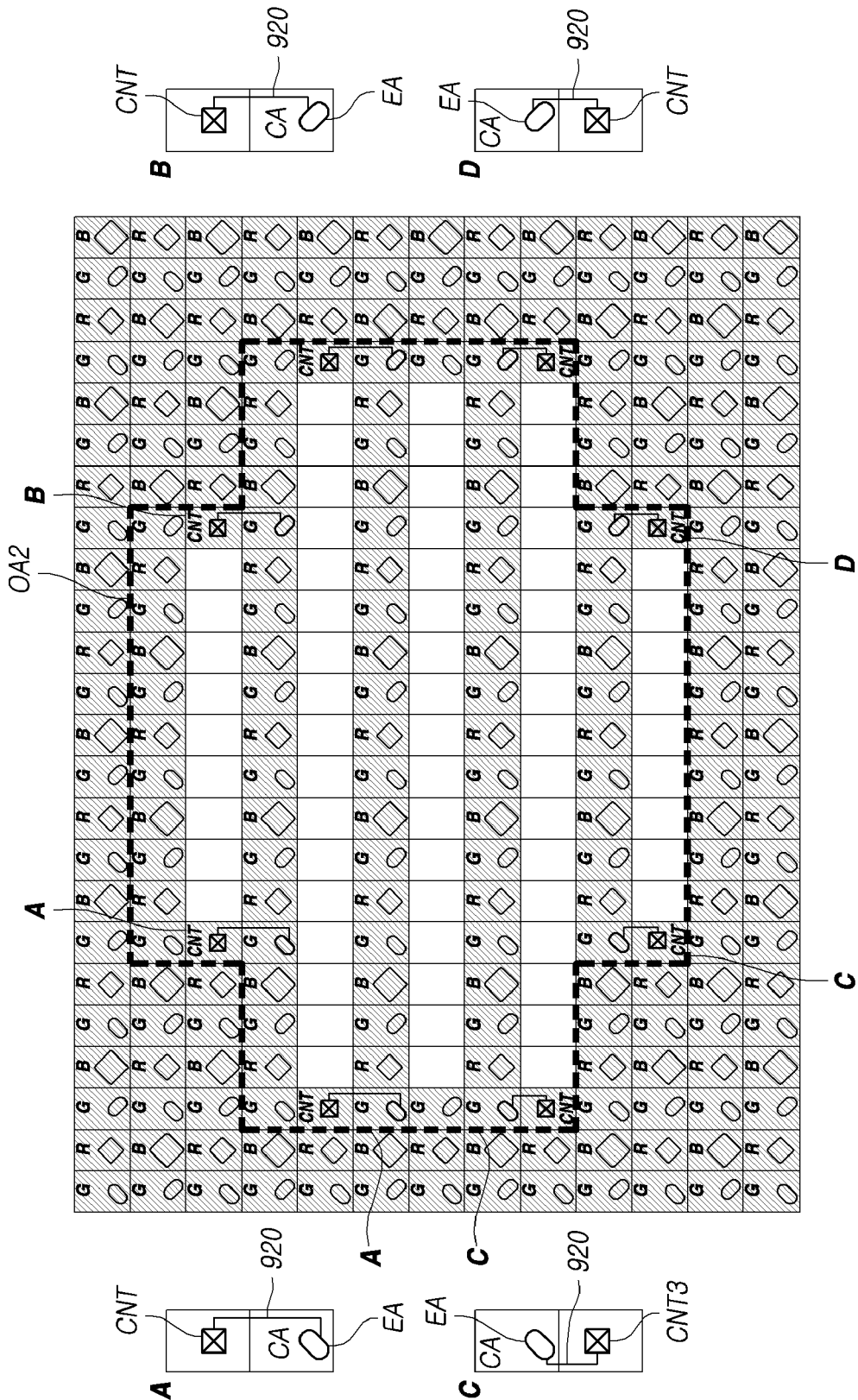
FIGS. 11 to 15 schematically illustrate first horizontal lines, light emitting areas connected to circuit areas of other light emitting areas according to an aspect of the present disclosure.

Referring to FIG. 11, the display includes a normal area (e.g., the normal area NA) and a second optical area (e.g., the second optical area OA2). A portion of the normal area NA can be placed on at least one side surface of the second optical area OA2.

The normal area NA can include a plurality of light emitting areas EA and one or more circuit areas CA overlapping the light emitting areas EA. Further, the second optical area OA2 can include a plurality of light emitting areas EA, one or more circuit areas CA overlapping the light emitting areas EA, and one or more second transmission areas TA2. A plurality of organic light emitting elements ED (e.g., organic light emitting diodes (OLED)) can be disposed to emit light in a direction toward an encapsulation layer disposed over a substrate.

Although a plurality of light emitting areas EA and one or more circuit areas CA driving the light emitting areas EA overlap, embodiments of the present disclosure are not limited thereto. For example, a light emitting area EA and a circuit area CA may not overlap each other. In this example, an organic light emitting element ED of the light emitting area EA can be configured to emit light in a direction toward the substrate over which the organic light emitting element ED is disposed. A transistor for driving a light emitting area can also not be placed in a portion of the second optical area OA2 adjacent to the normal area NA, in which one or more light emitting area EA are disposed.

As shown in FIG. 11, at least one light emitting area EA located in the second optical area OA2 adjacent to the normal area NA can be electrically connected to a transistor of another circuit area CA disposed in the second optical area OA2 through an extension portion 920. For example, the extension portion 920 can be connected to an anode node of a switching transistor disposed in another circuit area CA of the second optical area OA2, but embodiments of the present disclosure are not limited thereto.

Further, the light emitting area EA of the second optical area OA2 electrically connected to the transistor of the other circuit area CA can be a light emitting area EA overlapping the at least one first horizontal line HL1 including a connection portion 513.

As described above, a location of a first horizontal line HL1 can be shifted or bent through a connection portion 513 in an edge of the second optical area OA2 compared to a location of the first horizontal line HL1 in the normal area NA, and therefore, the first horizontal line HL1 does not overlap a second transmission area TA2 while overlapping a light emitting area EA of the second optical area OA2. Further, transistors for driving light emitting areas EA are not disposed in an area where connection portions 531 of a plurality of first horizontal lines HL1 are disposed and a nearby area.

In addition, a plurality of opaque electrodes included in each transistor can cause the transmittance of the second optical area OA2 to be reduced; however, according to embodiments of the present disclosure, by removing such transistors from one or more areas of the second optical area OA2, transmittance of the second optical area OA2 can be improved.

Referring to FIG. 11, when the display panel 110 is viewed from the front thereof, in respective upper portions of left and right edges of the second optical area OA2, one or more anode electrodes AE of one or more light emitting areas EA can be electrically connected to one or more circuit areas CA of other adjacent light emitting areas EA through one or more extension portions 920.

Thus, organic light emitting elements ED of light emitting areas EA disposed in the edge of the second optical area OA2 in which transistors are removed can be electrically connected to circuit areas CA of other light emitting areas EA located on, over, or near the one or more light emitting areas EA. When the display panel 110 is viewed from the front thereof, in respective lower portions of left and right edges of the second optical area OA2, anode electrodes AE of light emitting areas EA can be electrically connected to circuit areas CA of other adjacent light emitting areas EA through extension portions 920.

Thus, organic light emitting elements ED of light emitting areas EA disposed in the edge of the second optical area OA2 in which transistors are removed can be electrically connected to circuit areas CA of other light emitting areas EA located underneath, under, or near the light emitting areas EA. Here, the upper and lower portions can be divided based on a direction in which a second transmission area TA2 extends from the center of the display panel 110 (e.g., the horizontal direction).

Figure 12:
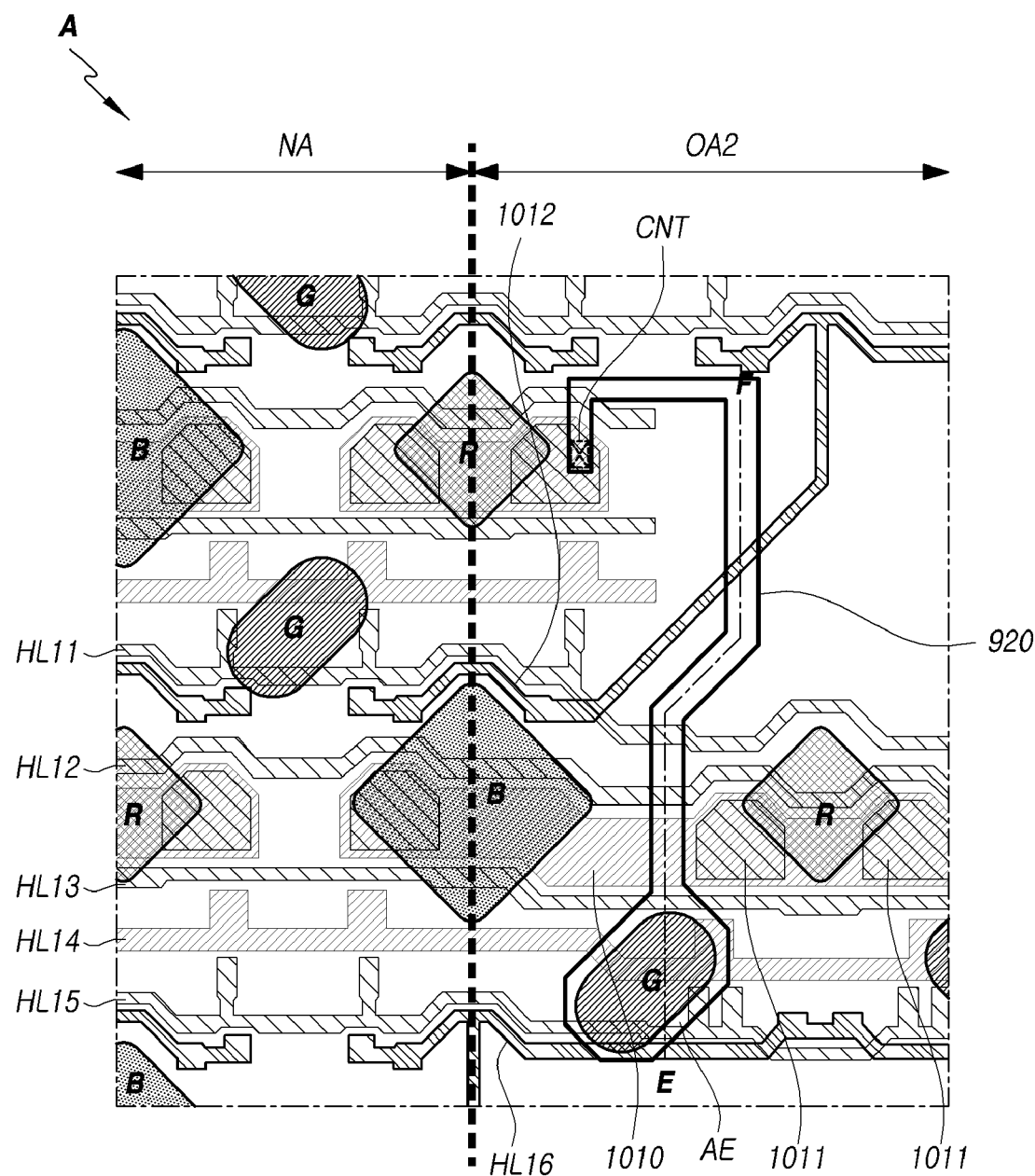
Figure 13:
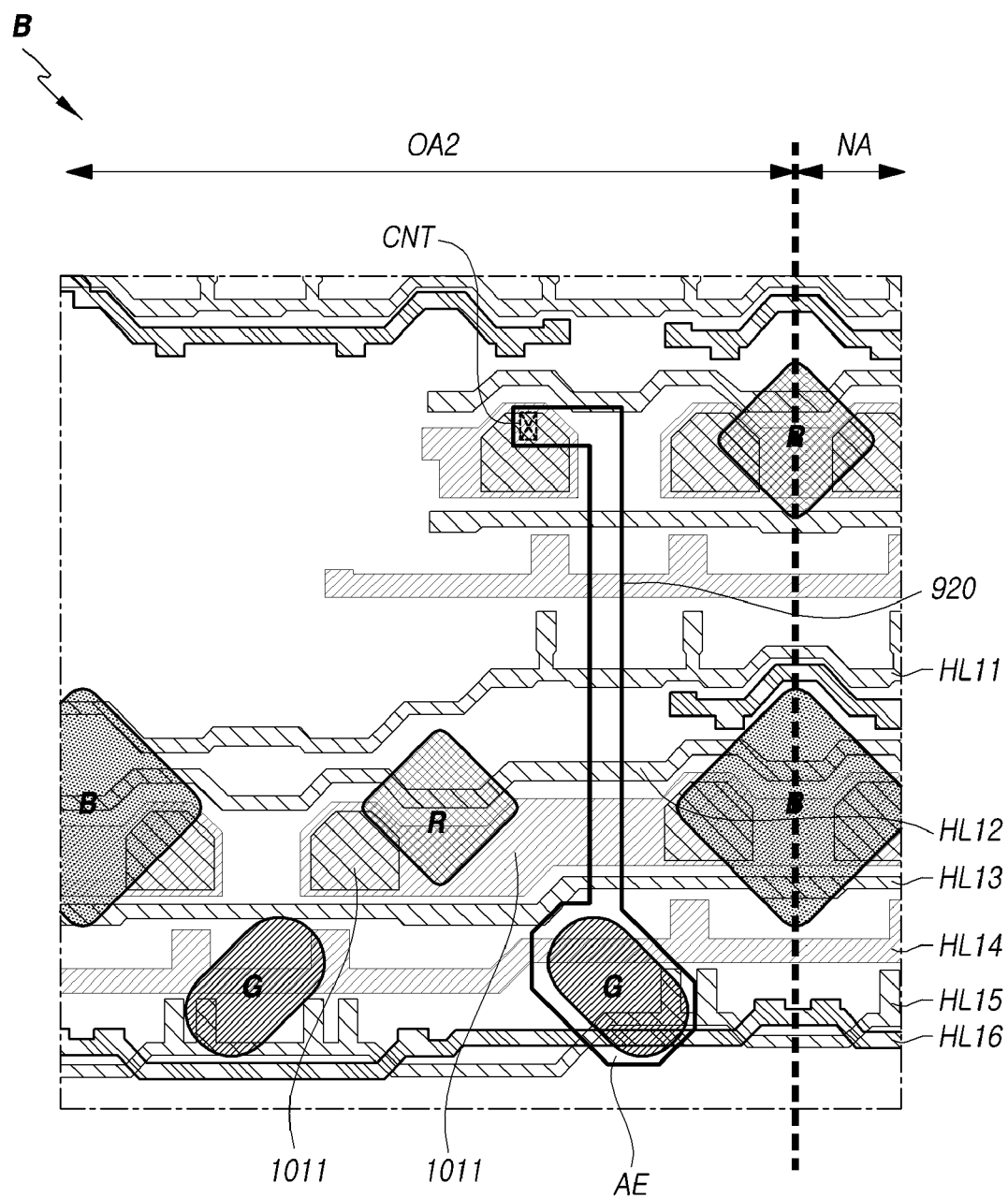

As illustrated in FIGS. 12 and 13, in an upper portion of the display panel 110, at least one light emitting area EA2 disposed in the second optical area OA2 can be electrically connected to a transistor disposed in a circuit area CA disposed in another adjacent light emitting area. For example, referring to FIGS. 12 to 15, a plurality of first horizontal lines HL1 needed for driving the light emitting areas EA1, EA2, and EA3 can be placed in the normal area NA and the second optical area OA2.

For example, a plurality of first horizontal lines (HL1, HL11, HL12, HL13, HL14, HL15, and HL16) can be used to drive first to third light emitting regions EA1, EA2, and EA3. Each of the first horizontal lines (HL11, HL12, HL13, HL14, HL15, and HL16) can have at least one bent portion such as at least one connection portion in the second optical area OA2 adjacent to the normal area NA.

Thus, even when the first horizontal lines (HL11, HL12, HL13, HL14, HL15, and HL16) disposed in the normal area NA extend to the second optical area OA2, they overlap only light emitting areas EA1, EA2, and EA3 and circuit areas of the second optical area OA2, and do not overlap a second transmission area TA2.

As illustrated in FIGS. 12 to 15, in addition to the first horizontal lines (HL11, HL12, HL13, HL14, HL15, and HL16), a metal pattern 1010 disposed in an edge of the second optical area OA2 can also include a bent portion in the second optical area OA2 adjacent to the normal area NA. The metal pattern 1010 can serve as an electrode pattern 1011 overlapping the metal pattern 1010 and an electrode of a storage capacitor Cst.

In addition, an anode electrode AE of an organic light emitting element ED of a second light emitting area EA2 overlapping at least one (HL14 and/or HL15) of the first horizontal lines (HL11, HL12, HL13, HL14, HL15, and HL16) can be electrically connected to a transistor disposed in an adjacent circuit area in the normal area NA. For example, as illustrated in FIGS. 12 and 13, the anode electrode AE of an organic light emitting element ED of a second light emitting area EA2 of the second optical area OA2 adjacent to the normal area NA can be connected to a circuit area overlapping another second light emitting area EA2 disposed over the second light emitting area EA2. For example, a second light emitting area EA2 disposed in an area where a transistor is removed can include an organic light emitting element ED, and the anode electrode AE of the organic light emitting element ED can include an extension portion 920.

The extension portion 920 can be electrically connected to a transistor through a contact hole CNT in the circuit area CA of another second light emitting area EA2 in a plan view. The transistor electrically connected to the extension portion 920 can be used for driving the other second light emitting area EA2. For example, the extension portion 920 can be connected to a switching transistor included in the circuit area CA overlapping the other second light emitting area EA2, but embodiments of the present disclosure are not limited thereto.

As illustrated in FIG. 13, the anode electrode AE of the organic light emitting element ED disposed in the second light emitting area EA2 can be electrically connected through a contact hole CNT to a storage capacitor Cst located in the circuit area CA overlapping the other second light emitting area EA2 through the extension portion 920.

The storage capacitor Cst electrically connected to the extension portion 920 can also be electrically connected to a transistor used to drive a second light emitting area EA2 (i.e., the other second light emitting area EA2) adjacent to the second light emitting area EA2 in which an organic light emitting element ED including the extension portion 920 is disposed among second light emitting areas EA2 of the second optical area OA2.

As illustrated in FIG. 12, a portion of the extension portion 920 can overlap a portion of the second transmission area TA2 of the second optical area OA2. However, the structure of the display panel 110 according to embodiments of the present disclosure is not limited thereto, and as illustrated in FIG. 13, the extension part 920 may not overlap a second transmission area TA2 of the second optical area OA2.

Figure 14:
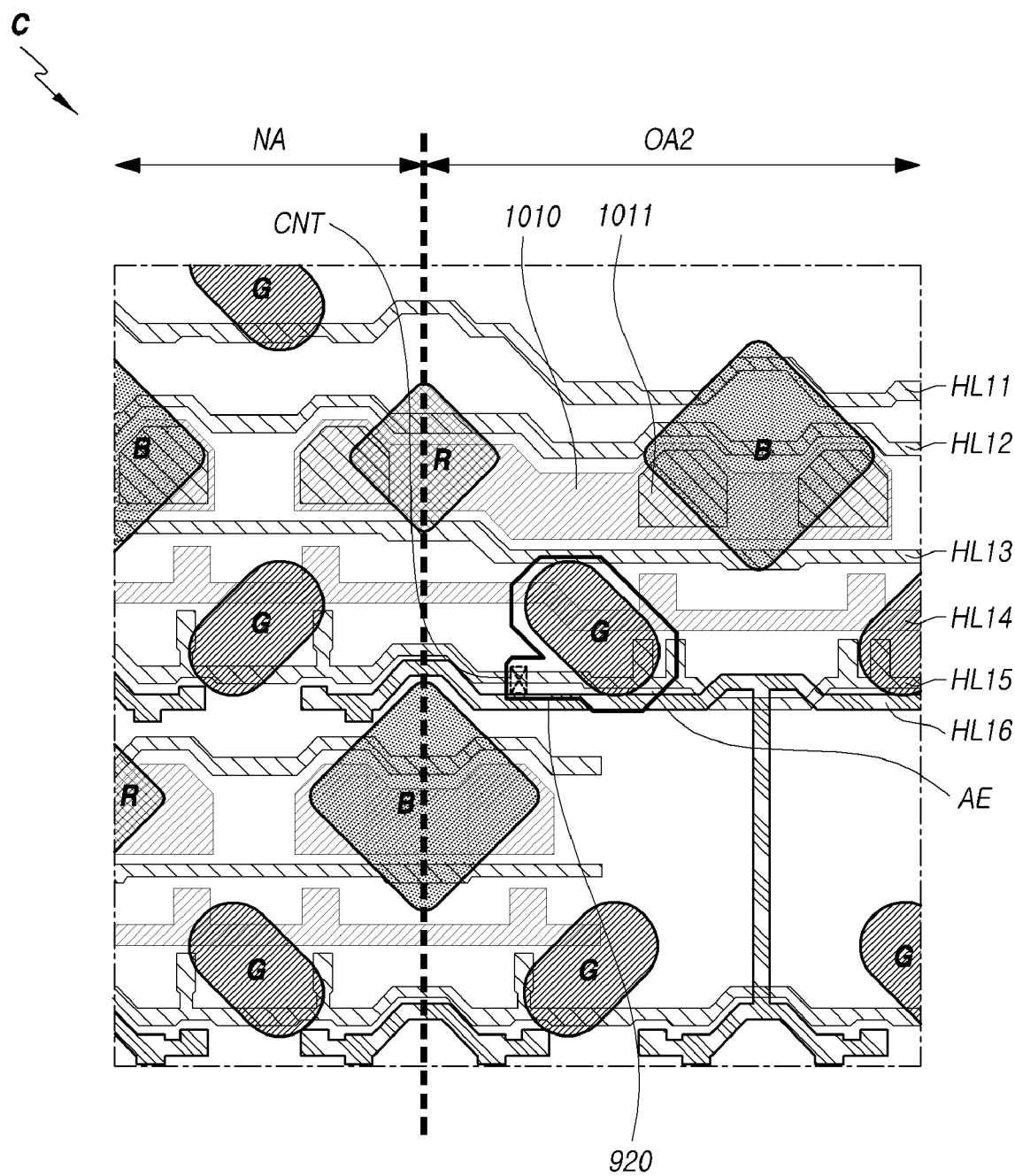
Figure 15:
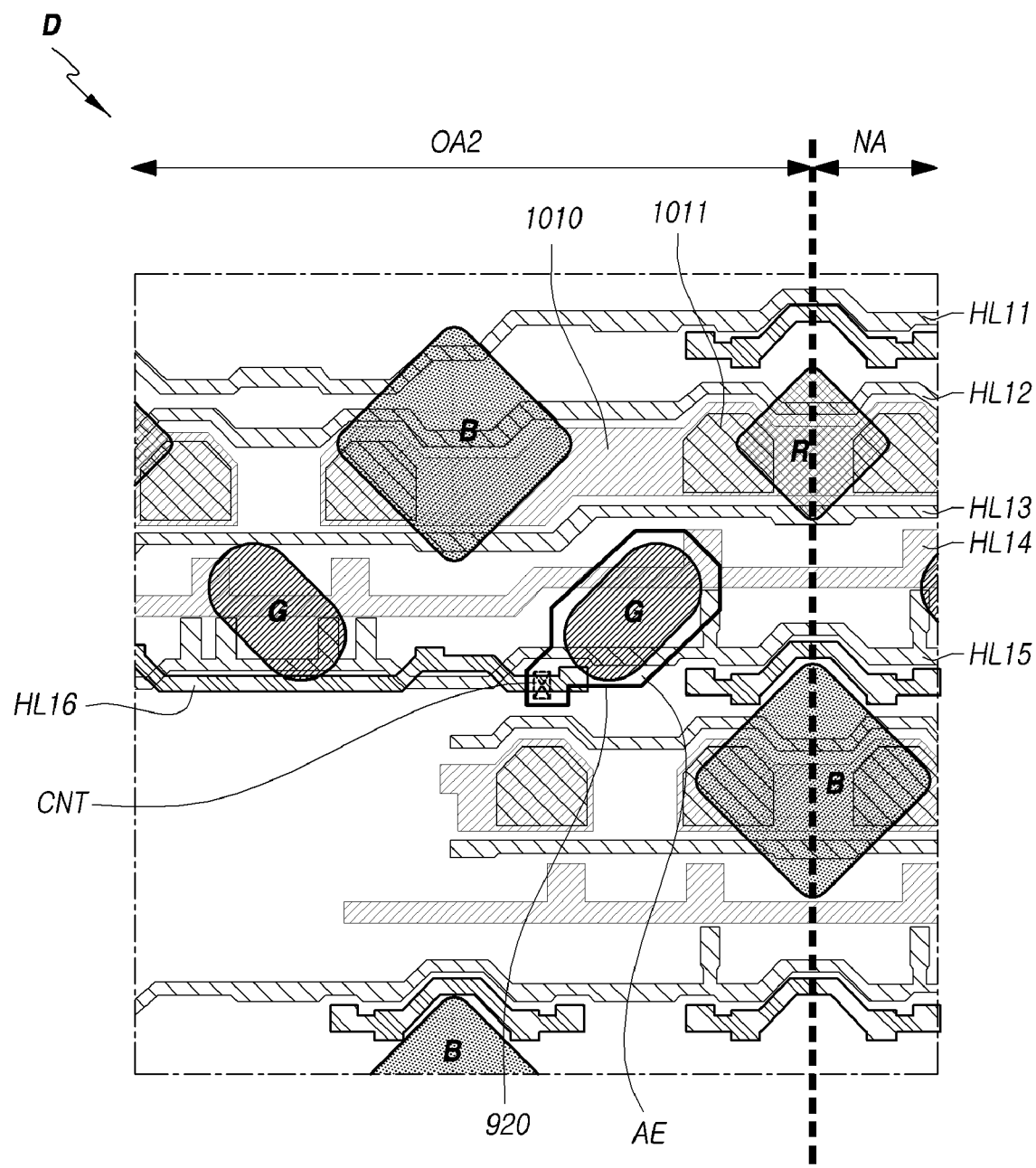

As illustrated in FIGS. 14 and 15, the anode electrode AE of an organic light emitting element ED of a second light emitting area EA2 adjacent to the normal area NA can be connected to a circuit area of another second light emitting area EA2 of the second optical area OA2 disposed under or near the second light emitting area EA2.

Further, the anode electrode AE of an organic light emitting element ED disposed in a second light emitting area EA2 disposed in an area where a transistor is removed can include an extension portion 920. The extension portion 920 can be electrically connected to a transistor through a contact hole CNT in a circuit area CA of another second light emitting area EA2 disposed under or near the second light emitting area EA2 in a plan view. The transistor electrically connected to the extension portion 920 can be one of transistors used for driving the other second light emitting area EA2.

Referring to FIGS. 12 to 15, among organic light emitting elements ED of light emitting areas EA disposed in the second optical area OA2, a length of an extension portion 920 connected to an adjacent circuit area CA other than the circuit area CA disposed under or near the organic light emitting element ED can be different for each location.

Referring to FIGS. 11 to 15, when the display panel 110 is viewed from the front thereof, each first horizontal lines (HL11, HL12, HL13, HL14, HL15, and HL16) has at least one bent portion in left and/or right edges of the second optical area OA2 relative to a direction in which the first horizontal lines (HL11, HL12, HL13, HL14, HL15, and HL16) extend, and thereby, the second transmission area TA2 of the second optical area OA2 and the first horizontal lines (HL11, HL12, HL13, HL14, HL15, and HL16) do not overlap, thus improving the transmittance of the second transmission area TA2.

In addition, as transistors for driving one or more light emitting areas EA are removed in left and/or right edges of the second optical area OA2, and one or more circuit elements of another adjacent light emitting area EA are shared, a reduction in transmittance due to the transistor can be reduced or eliminated, and thus, the transmittance of the second optical area OA2 can be improved.

Next, FIG. 16 is a cross-sectional view taken along with line E-F of FIG. 12 according to an aspect of the present disclosure. In particular, FIG. 16 illustrates a cross-sectional structure of a light emitting area and a circuit area in optical areas disposed in the display panel 110 according to an aspect of the present disclosure.

The following description is based on the second optical area OA2, but embodiments of the present disclosure are not limited thereto. For example, the first optical area OA1 in the figures described above can have the structure of FIG. 16.

Referring to FIG. 16, the second optical area OA2 of the display panel 110 includes a light emitting area EA (e.g., the second light emitting area EA2) and a circuit area CA overlapping the light emitting area EA. The second light emitting area EA2 can overlap at least one first horizontal line (HL14, HL15, and HL16). For example, a multi-buffer layer MBUF can be disposed on a substrate SUB, and a first active buffer layer ABUF1 can be disposed on the multi-buffer layer MBUF. A second active buffer layer ABUF2 and a gate insulating layer GI can be sequentially disposed on the first active buffer layer ABUF1.

In addition, a plurality of first horizontal lines (HL11, HL12, HL13, and HL15) can be spaced apart from each other on the gate insulating layer GI. Also, a first interlayer insulating layer ILD1 can be disposed on the gate insulating layer GI on which the first horizontal lines (HL11, HL12, HL13, and HL15) are disposed. A metal pattern 1010 and at least one first horizontal lines HL14 can be disposed on the first interlayer insulating layer ILD1. The metal pattern 1010 and the first horizontal line HL14 disposed in the same layer can also be spaced apart from each other.

A second interlayer insulating layer ILD2 is also disposed on the first interlayer insulating layer ILD1 on which the metal pattern 1010 and the at least one first horizontal line HL14 are disposed. Further, at least one first horizontal line HL16 can be disposed on the second interlayer insulating layer ILD2.

A passivation layer PAS0, a first planarization layer PLN1, and a second planarization layer PLN2 can also be sequentially disposed on the second interlayer insulating layer ILD2 on which the at least one first horizontal line HL16 is disposed. The anode electrode AE of an organic light emitting element ED such as an organic light emitting diode (OLED) can be disposed on the second planarization layer PNL2.

A bank BANK for covering a portion of the anode electrode AE of the organic light emitting element ED is disposed on the second planarization layer PNL2. An area corresponding to the second light emitting area EA2 can be an area in which the bank BANK does not overlap the anode electrode AE of the organic light emitting element ED.

In addition, a portion of the anode electrode AE can be exposed through an opening (the opened portion) of the bank BANK. An emission layer EL can then be disposed on side surfaces of the bank BANK and in the opening (the opened portion) of the bank BANK. All or at least a portion of the emission layer EL can be located between adjacent banks.

In the opening of the bank BANK, the emission layer EL can contact the anode electrode AE. Further, a cathode electrode CE can be disposed on the emission layer EL. The light emitting element ED can thus be formed by including the anode electrode AE, the emission layer EL, and the cathode electrode CE, as described above. The emission layer EL can also include an organic material layer.

As illustrated in FIG. 16, the second light emitting area EA2 disposed in the second optical area OA2 can overlap the first horizontal lines, and not overlap one or more transistors for driving the second light emitting area EA2. As described above, to improve the transmittance of the second optical area OA2, although one or more transistors for driving the second light emitting area EA2 are removed, the second light emitting area EA2 is electrically connected to another circuit area. That is, referring to FIG. 14, the anode electrode AE disposed in the second light emitting area EA2 extends along the second planarization layer PLN2 and is connected to a second source-drain electrode pattern SD2 of another adjacent circuit area CA in the second optical area OA2 through a contact hole CNT.

Further, the second source-drain electrode pattern SD2 can be electrically connected to anode electrodes AE disposed in the two light emitting areas EA2. An encapsulation layer ENCAP is also disposed on the stack of the light emitting element ED.

FIGS. 11 to 16 illustrate the anode electrode AE of an organic light emitting element ED disposed in each of one or more of second light emitting areas EA2 included in the second optical area OA2 includes an extension portion 920 electrically connected to a circuit area CA of another second light emitting area EA2 adjacent to the one or more second optical areas OA2, but embodiments of the present disclosure are not limited thereto. For example, the anode electrode AE of an organic light emitting element ED disposed in each of one or more of first light emitting areas EA1 and third light emitting area EA3 included in the second optical area OA2 can include an extension portion 920.

In addition, the display device 100 can include a second optical area OA2 and a normal area NA located outside of the second optical area OA2, and a non-display area NDA, and including a plurality of signal lines. The second optical area OA2 can include a plurality of light emitting areas EA and a plurality of second transmission areas TA2, and the normal area NA can include a plurality of light emitting areas EA. The signal lines includes a plurality of first horizontal lines HL1 extending from the normal area NA up to the second optical area OA2, and at least one of the first horizontal lines HL1 can include a first portion 511, a second portion 512, and a connection portion 513 disposed between the first portion 511 and the second portion 512. The connection portion 513 can be a portion extending in a direction intersecting the horizontal direction, and located in the second optical area OA2, for example, a portion of the second optical area OA2 adjacent to the normal area NA.

The display device can also include a second optical electronic device 12 located under, in a lower portion of, the display panel 110 and overlapping at least a portion of the second optical area OA2 included in the display area DA. One or more of the first horizontal lines HL1 may not overlap the second transmission areas TA2. Further, the connection portion 513 can extend in a direction inclined in a range of angles greater than or equal to −90° and less than 0° relative to the horizontal direction.

In this embodiment, the first portion 511 of the first horizontal line HL1 can be disposed in the normal area NA, and the second portion 512 of the first horizontal line HL1 can be disposed in the second optical area OA2, and the second portion 512 can be placed at a lower location than the first portion 511 in a plan view. The connection portion 513 can extend in a direction inclined in a range of angles greater than 0° and less than or equal to 90° relative to the horizontal direction.

Further, the first portion 511 of the first horizontal line HL1 can be disposed in the normal area NA, and the second portion 512 of the first horizontal line HL1 can be disposed in the second optical area OA2, and the second portion 512 can be placed at a higher location than the first portion 511 in the plan view. The second optical area OA2 can include at least one light emitting area EA overlapping the connection portion 513 of the at least one first horizontal line HL1.

In addition, the light emitting area EA overlapping the connection portion 513 may not overlap a circuit area CA for driving the light emitting area EA, and a light emitting area EA not overlapping the connection portion 513 can overlap the circuit area CA for driving the light emitting area EA. The anode electrode AE of an organic light emitting diode ED of the light emitting area EA overlapping the connection portion 513 can also include an extension portion 920.

The extension portion 920 can be electrically connected to a circuit area CA for driving another light emitting area EA in the second optical area OA2. The display area DA can further include a first optical area OA1 different from the second optical area OA2 and the normal area NA. The display device may further include a first optical electronic device 11 located under, or in a lower portion of, the display panel, and overlapping at least a portion of the first optical area OA1. The normal area NA may or may not be disposed between the first and second optical areas OA1 and OA2.

Further, the first optical area OA1 can include a plurality of light emitting areas and a plurality of first transmission areas TA1, and the connection portion 513 of the first horizontal line HL1 can be disposed in the first optical area OA1, for example, a portion of the first optical area OA1 adjacent to the normal area NA. Also, the first optical electronic device 11 can be a camera, and the second optical electronic device 12 can be a sensor such as a proximity sensor, an illuminance sensor, and the like. In another embodiment, the second optical electronic device 12 can be a camera, and the first optical electronic device 11 can be a sensor such as a proximity sensor, an illuminance sensor, and the like.

In addition, the transmittance of the first optical area OA1 can be greater than or equal to the transmittance of the second optical area OA2. Also, the display panel can further include a cathode electrode CE disposed in a plurality of light emitting areas EA included in the normal area NA and the first optical area OA1 and not disposed in a plurality of transmission areas TA1 in the first optical area OA1.

The signal lines further includes at least one second horizontal line HL2 disposed in the normal area NA. The first and second horizontal lines HL1 and HL2 are signal lines for transmitting the same type of signals. A length of the first horizontal line HL1 can be longer than a length of the second horizontal line HL2, and a resistance-capacitance (RC) value of the second horizontal line HL2 can be the same as an RC value of the first horizontal line HL1.

The display panel can also include a substrate SUB including a display area DA with a second optical area OA2 at least partially overlapping a second optical electronic device 12 located under the substrate SUB, and a normal area NA located outside of the second optical area OA2, and a non-display area NDA, and including a plurality of signal lines disposed on the substrate SUB.

The second optical area OA2 can include a plurality of light emitting areas EA and second transmission areas TA2, and the normal areas NA can include light emitting areas EA. The signal lines can include a plurality of first horizontal lines HL1. Also, the light emitting areas EA of the normal area NA and the light emitting areas EA of the second optical area OA2 can be disposed in a same row. Further, the light emitting areas EA of the normal area NA and the light emitting areas EA of the second optical area OA2 disposed in the same row can share the first horizontal lines.

Each first horizontal line HL1 shared by the light emitting areas EA of the normal area NA and the second optical area OA2 can include a first portion 511, a second portion 512, and a connection portion 513 disposed between the first and second portions. Also, the connection portion 513 can extend in a direction intersecting the horizontal direction, and be located in the second optical area OA2, for example, a portion of the second optical area OA2 adjacent to the normal area NA.

The above description has been presented to enable any person skilled in the art to make and use the invention, and has been provided in the context of a particular application and its requirements. Various modifications, additions and substitutions to the described embodiments will be readily apparent to those skilled in the art, and the general principles defined herein can be applied to other embodiments and applications without departing from the spirit and scope of the present invention. Although the exemplary embodiments have been described for illustrative purposes, a person skilled in the art will appreciate that various modifications and applications are possible without departing from the essential characteristics of the present disclosure. For example, the specific components of the exemplary embodiments can be variously modified. The above description and the accompanying drawings provide an example of the technical idea of the present invention for illustrative purposes only. That is, the disclosed embodiments are intended to illustrate the scope of the technical idea of the present disclosure. Thus, the scope of the present disclosure is not limited to the embodiments shown, but is to be accorded the widest scope consistent with the claims. The scope of protection of the present disclosure is to be construed according to the claims, and all technical ideas within the scope of the claims should be interpreted as being included in the scope of the present invention.

What is claimed is:

1. A display device comprising:
    a display panel including a plurality of light emitting areas; and
    a first optical electronic device located under the display panel,
    wherein a first optical area of the display panel overlapping the first optical electronic device comprises a plurality of first light transmission areas in addition to the plurality of light emitting areas,
    wherein a normal area of the display panel not overlapping the first optical electronic device includes the plurality of light emitting areas without including the plurality of first light transmission areas,
    wherein a plurality of first horizontal lines for controlling the plurality of light emitting areas horizontally extend across the normal area and the first optical area,
    wherein the plurality of light emitting areas included in the normal area and the first optical area are arranged in a same row,
    wherein the plurality of light emitting areas disposed in the same row receive signals through one or more same first horizontal lines of the plurality of first horizontal lines,
    wherein each of the one or more same first horizontal lines comprises a first portion extending horizontally across the normal area, a second portion extending horizontally across the first optical area, and a connection portion located in the first optical area and connecting the first portion and the second portion, and
    wherein the connection portion is angled with respect to the first and second portions such that the second portion is shifted upwards or downwards from the first portion.

2. The display device according to claim 1, wherein the connection portion is located in a portion of the first optical area that is adjacent to the normal area.

3. The display device according to claim 1, wherein the display panel includes a substrate, a planarization layer and an encapsulation layer, and
    wherein the plurality of first light transmission areas include a depression in at least one of the substrate, the planarization layer and the encapsulation layer depressing downwards towards a rear surface of the display device.

4. The display device according to claim 1, wherein the plurality of first horizontal lines pass around outer surfaces of the plurality of first light transmission areas when crossing the first optical area.

5. The display device according to claim 1, wherein the connection portion is inclined in a range of angles greater than or equal to −90° and less than 0° relative to the first and second portions such that the second portion is shifted downwards from the first portion.

6. The display device according to claim 1, wherein the connection portion is inclined in a range of angles greater than 0° and less than or equal to −90° relative to the first and second portions such that the second portion is shifted upwards from the first portion.

7. The display device according to claim 1, wherein the first and second portions run parallel to each other.

8. The display device according to claim 1, wherein edge light emitting areas at an edge of the first optical area overlap the connection portions of the plurality of first light transmission areas.

9. The display device according to claim 8, wherein the edge light emitting areas do not overlap a circuit area for driving other light emitting areas in another row, and
    wherein the other light emitting areas overlap the circuit area.

10. The display device according to claim 9, wherein at least one edge light emitting area emitting a first color at the edge of the first optical area is an organic light emitting diode with an anode electrode comprising an extension portion extending to another light emitting area emitting a second color at the edge of the first optical area.

11. The display device according to claim 10, wherein the extension portion is electrically connected to the circuit area for driving the other light emitting area emitting the second color.

12. The display device according to claim 10, further comprising:
- a second optical electronic device located under the display panel,
- wherein a second optical area of the display panel overlapping the second optical electronic device comprises a plurality of second light transmission areas in addition to the plurality of light emitting areas, and
- wherein the normal area is disposed between the first optical area and the second optical area.

13. The display device according to claim 12, wherein the first optical electronic device is a camera, and the second optical electronic device is a sensor, and
- wherein a light transmittance of the first optical area is greater than a light transmittance of the second optical area.

14. The display device according to claim 12,
- wherein the connection portion is located in a portion of the second optical area that is adjacent to the normal area.

15. The display device according to claim 12, wherein the display panel further comprises a cathode electrode disposed in the plurality of light emitting areas of the normal area and the second optical area and not disposed in a plurality of second transmission areas of the second optical area.

16. The display device according to claim 1, wherein the signal lines further comprise a plurality of second horizontal lines disposed in the normal area,
- wherein the plurality of first horizontal lines and the plurality of second horizontal lines transmit a same type of control signals, and
- wherein each of a length of the plurality of first horizontal lines is longer than each of a length of the plurality of second horizontal lines, and each of an RC value of the plurality of second horizontal lines is the same as each of an RC value of the plurality of first horizontal lines.

17. A display panel comprising:
- a substrate divided into a first optical area including a plurality of light emitting elements and first light transmission areas arranged to overlap a first optical electronic device disposed below the substrate, and divided into a normal area not overlapping the first optical electronic device, wherein the normal area includes the plurality of light emitting elements without including the plurality of first light transmission areas; and
- a plurality of first horizontal lines on the substrate horizontally extending across the normal area and the first optical area for controlling the plurality of light emitting elements,
- wherein the plurality of light emitting elements included in the normal area and the plurality of light emitting elements included in the first optical area are arranged in a same row,
- wherein the plurality of light emitting elements disposed in the same row receive signals through one or more same first horizontal lines of the plurality of first horizontal lines,
- wherein each of the one or more same first horizontal lines comprises a first portion extending horizontally across the normal area, a second portion extending horizontally across the first optical area, and a connection portion located in the first optical area and connecting the first portion and the second portion, and
- wherein the connection portion is angled with respect to the first and second portions such that the second portion is shifted upwards or downwards from the first portion.

18. The display panel according to claim 17, wherein the plurality of first horizontal lines pass around outer surfaces of the plurality of first light transmission areas when horizontally crossing the first optical area.

19. The display panel according to claim 17, wherein the substrate is further divided into a second optical area overlapping a second optical electronic device disposed below the substrate,
- wherein the second optical area comprises a plurality of second light transmission areas in addition to the plurality of light emitting elements, and
- wherein the normal area is disposed between the first optical area and the second optical area.

20. The display panel according to claim 19, wherein the first optical electronic device is a camera, and the second optical electronic device is a sensor, and
- wherein a light transmittance of the first optical area is greater than a light transmittance of the second optical area.

* * * * *